US012713621B2

(12) United States Patent
Lee et al.

(10) Patent No.: US 12,713,621 B2
(45) Date of Patent: Aug. 18, 2026

(54) RESISTIVE MEMORY DEVICE

(71) Applicant: SAMSUNG ELECTRONICS CO., LTD., Suwon-si (KR)

(72) Inventors: Min Jun Lee, Suwon-si (KR); Yong Seok Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 587 days.

(21) Appl. No.: 18/111,921

(22) Filed: Feb. 21, 2023

(65) Prior Publication Data

US 2023/0397443 A1 Dec. 7, 2023

(30) Foreign Application Priority Data

Jun. 3, 2022 (KR) ........................ 10-2022-0068366

(51) Int. Cl.
*H10B 63/00* (2023.01)
*G11C 13/00* (2006.01)

(52) U.S. Cl.
CPC ....... *H10B 63/845* (2023.02); *G11C 13/0004* (2013.01); *G11C 13/004* (2013.01); *H10B 63/34* (2023.02); *G11C 2213/32* (2013.01); *G11C 2213/71* (2013.01); *G11C 2213/79* (2013.01)

(58) Field of Classification Search
CPC ............ G11C 13/0004; G11C 13/0007; G11C 2213/71; H10N 70/20; H10B 63/80
See application file for complete search history.

(56) References Cited

U.S. PATENT DOCUMENTS 9,698,202 B2 7/2017 Takaki
10,157,653 B1 12/2018 Li
11,074,989 B2 7/2021 Huang et al.
11,164,907 B2 11/2021 Balakrishnan et al.
11,201,193 B2 12/2021 Yang et al.
2013/0223126 A1 8/2013 Kwak et al.
2020/0098827 A1* 3/2020 Murooka ............. H10B 63/845
2021/0210555 A1 7/2021 Yano

* cited by examiner

*Primary Examiner* — Uyen Smet
(74) *Attorney, Agent, or Firm* — MORGAN, LEWIS & BOCKIUS LLP

(57) ABSTRACT

A resistive memory device includes: a substrate; a plurality of row lines extending in a first direction and spaced apart from each other in a second direction and a third direction, on the substrate, wherein the first direction, the second direction, and the third direction intersect each other; a plurality of column lines extending in the second direction and spaced apart from each other in the first direction, on the substrate; a plurality of upper selection lines extending in the second direction, between the row lines and the column lines; a channel layer extending in the third direction and connected to the plurality of row lines; and a first impurity region and a second impurity region spaced apart from each other in the third direction with the upper selection line interposed therebetween.

20 Claims, 39 Drawing Sheets

RESISTIVE MEMORY DEVICE

CROSS-REFERENCE TO RELATED APPLICATION

This application claims priority under 35 U.S.C. 119(a) to Korean Patent Application No. 10-2022-0068366, filed on Jun. 3, 2022, in the Korean Intellectual Property Office, the disclosure of which is incorporated by reference herein in its entirety.

TECHNICAL FIELD

The present inventive concept relates to a resistive memory device. More particularly, the present inventive concept relates to a resistive memory device including an upper selection line.

DISCUSSION OF THE RELATED ART

A random access memory (RAM) may include a volatile memory and a non-volatile memory. The volatile memory loses information stored therein whenever its power source is removed, whereas the non-volatile memory may retain the data stored therein even when its power source is removed.

Generally, the non-volatile memory may include a resistive memory that stores data in response to changes in resistance of a memory cell. In recent years, research about resistive memory devices that are used in chips that form a next-generation neuromorphic computing platform or a neural network is being conducted. In the case of the resistive memory, since current may flow through memory cells other than the memory cell to be read, there is a risk of an occurrence of leakage current.

SUMMARY

Aspects of the present inventive concept provide a resistive memory device having increased efficiency.

According to an embodiment of the present inventive concept, a resistive memory device includes: a substrate; a plurality of row lines extending in a first direction and spaced apart from each other in a second direction and a third direction, on the substrate, wherein the first direction, the second direction, and the third direction intersect each other; a plurality of column lines extending in the second direction and spaced apart from each other in the first direction, on the substrate; a plurality of upper selection lines extending in the second direction, between the row lines and the column lines; a channel layer extending in the third direction and connected to the plurality of row lines; and a first impurity region and a second impurity region spaced apart from each other in the third direction with the upper selection line interposed therebetween.

According to an embodiment of the present inventive concept, a resistive memory device includes: a first row line extending in a first direction; first and second column lines extending in a second direction intersecting the first direction and spaced apart from each other in the first direction; a first upper selection line extending in the second direction and connected to the first column line; a second upper selection line extending in the second direction and connected to the second column line; and a memory cell which is connected to the first row line and the first column line and stores data, wherein the first upper selection line is activated and the second upper selection line is deactivated in response to a read command for reading the data stored in the memory cell.

According to an embodiment of the present inventive concept, a resistive memory device includes: a substrate; first and second row lines extending in a first direction and spaced apart from each other in a second direction, on the substrate, wherein the second direction intersects the first direction; first and second column lines extending in the second direction and spaced apart from each other in the first direction, on the substrate; first and second upper selection lines extending in the second direction, between the first and second row lines and the first and second column lines; first and second lower selection lines extending in the first direction, between the first and second upper selection lines and the first and second column lines; a memory cell which is connected to the first row line and the first column line and stores data; first and second impurity regions spaced apart from each other in a third direction with the first upper selection line interposed therebetween, wherein the third direction intersects the first and second direction; and a third impurity region placed on a first side of the first lower selection line, wherein the second impurity region is placed on a second side, opposite to the first side, of the first lower selection line and spaced apart from the third impurity region in the third direction, and wherein the first upper selection line and the first lower selection line are activated and the second upper selection line and the second lower selection line are deactivated, in response to a read command for reading the data stored in the memory cell.

BRIEF DESCRIPTION OF THE DRAWINGS

The above features of the present inventive concept will become more apparent by describing in detail embodiments thereof with reference to the attached drawings, in which.

DETAILED DESCRIPTION OF THE EMBODIMENTS

Hereinafter, embodiments of the present inventive concept will be described with reference to the accompanying drawings.

A crossbar array of resistive memory devices according to an embodiment of the present inventive concept will be described below with reference to FIGS. 1 to 3.

Figure 1:
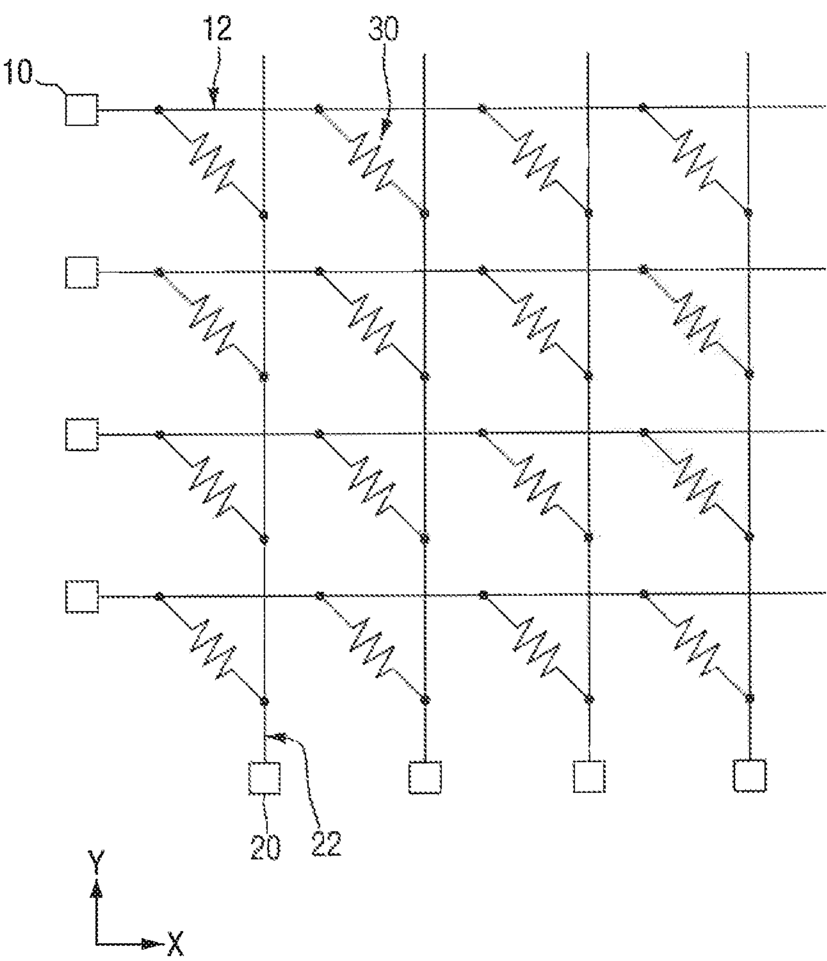
FIG. 1 is a diagram illustrating a crossbar array of the resistive memory device according to an embodiment of the present inventive concept.

FIG. 1 is a diagram for illustrating a crossbar array of the resistive memory device according to an embodiment of the present inventive concept;

Referring to FIG. 1, the crossbar array may include a plurality of presynaptic neurons 10, a plurality of postsynaptic neurons 20, and a synapse 30 that connects each of the presynaptic neurons 10 to the postsynaptic neurons 20. The synapse 30 is located between the plurality of presynaptic neurons 10 and the plurality of postsynaptic neurons 20. The synapse 30 may be, but is not limited to, a memory cell of a resistive memory device.

In an embodiment of the present inventive concept, although the crossbar array may include four presynaptic neurons 10, four postsynaptic neurons 20, and sixteen synapses 30, the number thereof is only for convenience of explanation as an example, and the present inventive concept is not limited thereto. These numbers may be modified in various manners. When the number of presynaptic neurons 10 is n (n is a natural number of 2 or more) and the number of postsynaptic neurons 20 is m (m is a natural number of 2 or more), n*m synapses 30 may be arranged in the form of a matrix.

For example, a wiring 12 connected to each of the plurality of presynaptic neurons 10 and extending in a first direction X may be provided, and a wiring 22 connected to each of the plurality of postsynaptic neurons 20 and extending in a second direction Y intersecting the first direction may be provided. The first direction X may intersect the second direction Y, and the first direction X may be substantially perpendicular to the second direction Y.

Hereinafter, for convenience of explanation, the wiring 12 extending in the first direction X will be referred to as a row line, and the wiring 22 extending in the second direction Y will be referred to as a column line. The plurality of synapses 30 may be placed at each intersection between the row line 12 and the column line 22, and connected to the corresponding row line 12 and the corresponding column line 22.

The presynaptic neuron 10 may generate and send a signal, e.g., a signal corresponding to particular data, to the row line 12. The postsynaptic neuron 20 may receive and process synaptic signals, which have passed through the synapses 30, through the column lines 22. The presynaptic neuron 10 may correspond to an axon, and the postsynaptic neuron 20 may correspond to a neuron. However, whether a neuron is a presynaptic neuron or a postsynaptic neuron may be determined by a relative relationship with other neurons.

For example, the presynaptic neuron 10 may function as a postsynaptic neuron when it receives a synaptic signal in relation to another neuron. When the postsynaptic neuron 20 may function as a presynaptic neuron when it sends signals in relation to other neurons. The presynaptic neuron 10 and the postsynaptic neuron 20 may be implemented as various circuits such as a CMOS.

Connections between the presynaptic neuron 10 and the postsynaptic neuron 20 may be made through the synapse 30. Here, the synapse 30 may be an element whose electrical conductance, weight or resistance changes with an electrical pulse applied to both ends, e.g., a voltage or a current.

For example, the synapse 30 may include a variable resistance element. The variable resistance element is an element that may switch between different resistance states depending on the voltage or current applied to both ends of the synapse 30. The variable resistance element may have a single-layer or multi-layer structure including various materials that may have multiple resistance states.

The aforementioned materials may include, for example, transition metal oxides, metal oxides such as perovskite-based materials, phase-change materials such as chalcogenide-based materials, ferroelectric materials, ferromagnetic materials, and the like. An operation in which the variable resistance element and the synapse 30 change from a high resistance state to a low resistance state is called a set operation, and an operation in which the synapse 30 changes from the low resistance state to the high resistance state is called a reset operation.

Figure 2:
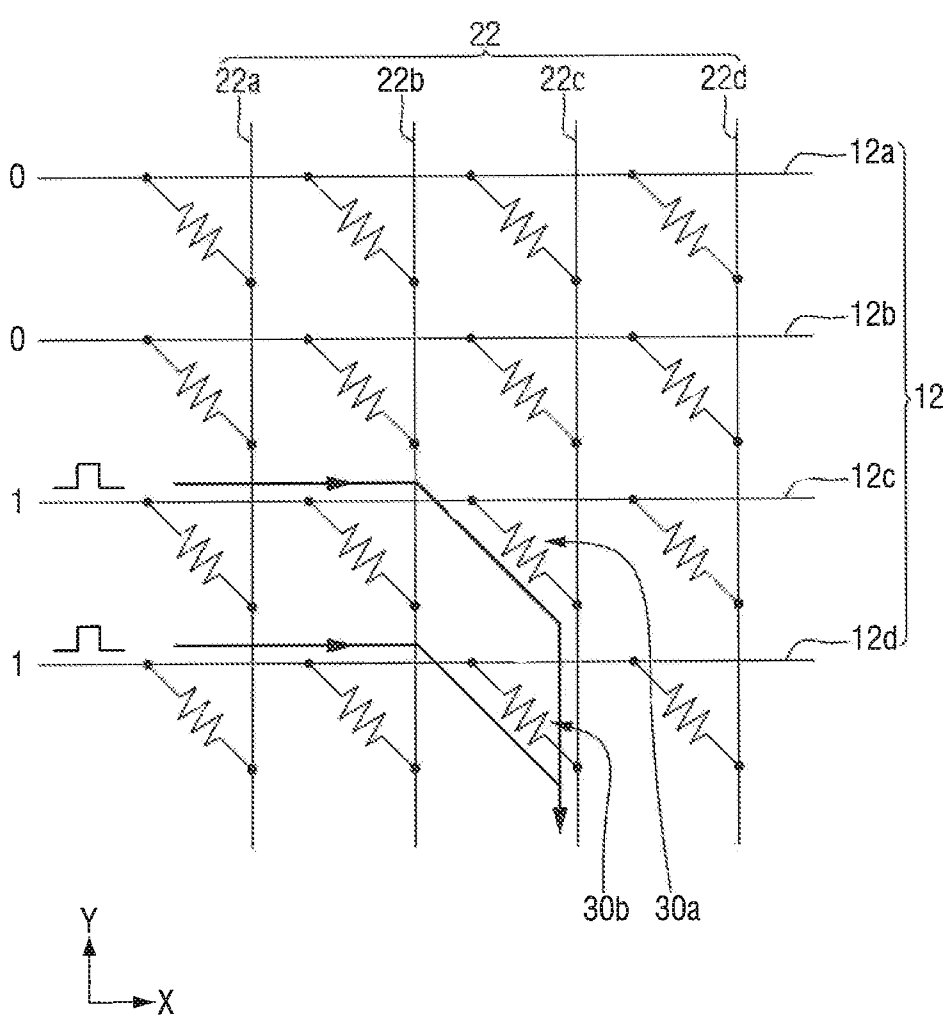
FIG. 2 is a diagram illustrating a method for operating the crossbar array of FIG. 1.

FIG. 2 is a diagram for illustrating a method for operating the crossbar array of FIG. 1. The operation of the crossbar array of FIG. 1 will be described below with reference to FIG. 2. For convenience of explanation, the row lines 12 include a first row line 12*a*, a second row line 12*b*, a third row line 12*c*, and a fourth row line 12*d*, sequentially from the top. The column lines 22 include a first column line 22*a*, a second column line 22*b*, a third column line 22*c*, and a fourth column line 22*d*, sequentially from a left side.

Referring to FIG. 2, in an initial state, all the synapses 30 may be in a state of relatively low conductance, that is, a high resistance state. If at least some of the plurality of synapses 30 are in a low resistance state, an initialization operation of bring them into the high resistance state may be additionally required. Each of the plurality of synapses 30 may have a predetermined threshold value for changes in resistance and conductance. For example, when a voltage or current having a magnitude lower than a predetermined threshold value is applied to both ends of each synapse 30, the conductance (or resistance) of the synapse 30 does not change, and when a voltage or current higher than the predetermined threshold value is applied to the synapse 30, the conductance (or resistance) of the synapse 30 may change.

In this state, an input signal corresponding to the particular data may enter the row line 12 to perform the operation of outputting the particular data as a result of the particular column line 22. At this time, the input signal may appear as an application of an electrical pulse to each of the row lines 12. For example, when an input signal corresponding to data of '0011' enters the row line 12, no electric pulse is applied to the row line 12 corresponding to '0' e.g., the first and second row lines 12*a* and 12*b*. An electrical pulse may be applied to the row lines 12 corresponding to '1', e.g., the third and fourth row lines 12*c* and 12*d*. At this time, the column line 22 may be driven with the appropriate voltage or current for output.

As an example, if the column line 22 for outputting particular data is already determined, the column line 22 may be driven such that the synapse 30 located at the intersection with the row line 12 corresponding to '1' is applied with voltage having a magnitude equal to or greater than the voltage (hereafter, a set voltage) required at the time of the set operation. The remaining column lines 22 may be driven such that the remaining synapse 30 is applied with a voltage of magnitude lower than the set voltage.

For example, if the magnitude of the set voltage is $V_{set}$ and the column line 22 that outputs data '0011' is a third column line 22*c*, the voltage applied to the third column line 22*c* may be, for example, 0V such that the first and second synapses 30*a* and 30*b* located at the intersection with the third column line 22*c* and the third and fourth row lines 12*c* and 12*d* are applied with a voltage equal to or higher than $V_{set}$. Therefore, the first and second synapses 30*a* and 30*b* may be brought into a low resistance state. The conductance of the first and second synapses 30*a* and 30*b* of the low resistance state may gradually increase as the number of electrical pulses increases. The magnitude and width of the applied electrical pulse may be substantially constant.

The voltage applied to the remaining column lines, i.e., the first, second and fourth column lines 22*a*, 22*b* and 22*d* may have a value between 0V and $V_{set}$, for example, a value of ½ $V_{set}$ such that the remaining synapses 30 except the first and second synapses 30*a* and 30*b* are applied with the voltage value lower than $V_{set}$. Therefore, the resistance states of the remaining synapses 30 except for the first and second synapses 30*a* and 30*b*, might not change. The flow of current or electrons in this case is indicated by solid arrows.

As another example, the column line 22 which outputs particular data might not be determined. In such a case, the current flowing through each of the column lines 22 is measured while an electrical pulse corresponding to particular data is applied to the row line 12, and the column line 22 that reaches a predetermined threshold current first, for example, the third column line 22*c*, may be a column line 22 that outputs particular data.

As described above, different data may be output to different column lines 22, respectively.

Figure 3:
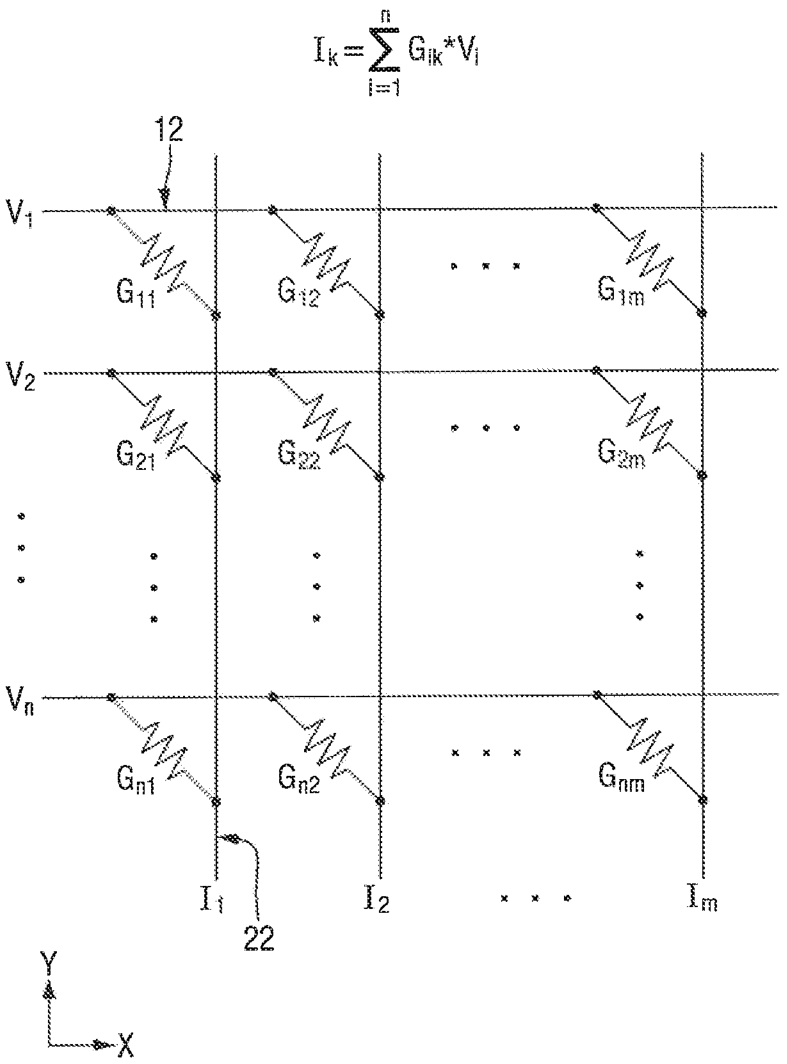
FIG. 3 is a diagram illustrating a computation performed in the crossbar array according to an embodiment of the present inventive concept.

FIG. 3 is a diagram illustrating a computation performed in the crossbar array according to an embodiment of the present inventive concept.

Referring to FIG. 3, a vector multiplication computation may be performed, using the memory cells of the crossbar array.

There are n row lines 12 and m column lines 22. In this case, n*m synapses may be provided. First, an input value may be received through the row line 12. The input values may be voltages $V_1$ to $V_n$. Weight values may be stored in synapses, that is, memory cells, for example, using the methods described above. The weight values stored in the memory cells may be conductance $G_{11}$ to $G_{nm}$. The conductance may be 1/resistance. The output values may be represented by currents $I_1$ to $I_m$, which are multiplication computation result values between voltage and conductance.

For example, the output value $I_k$ that is output through a k-th column line 22 from the left may be represented by the following Formula (1).

$$I_k = \sum_{i=1}^{n} G_{ik} * V_i \quad \text{[Formula 1]}$$

Structures of the resistive memory device according to an embodiment of the present inventive concept will be described below with reference to FIGS. 4 to 7.

Figure 4:
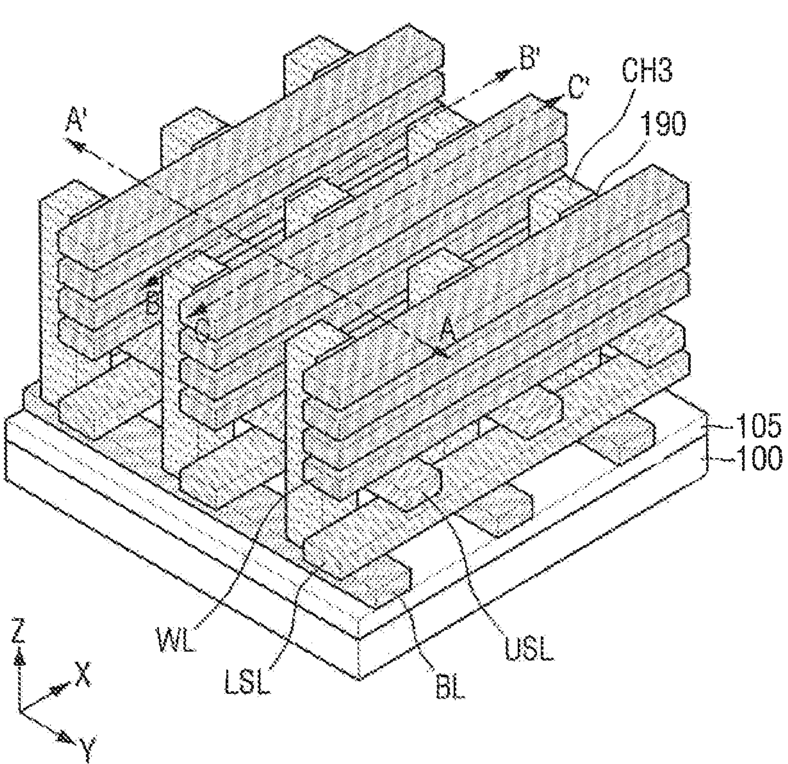
FIG. 4 is a perspective view of a resistive memory device according to an embodiment of the present inventive concept.
Figure 5:
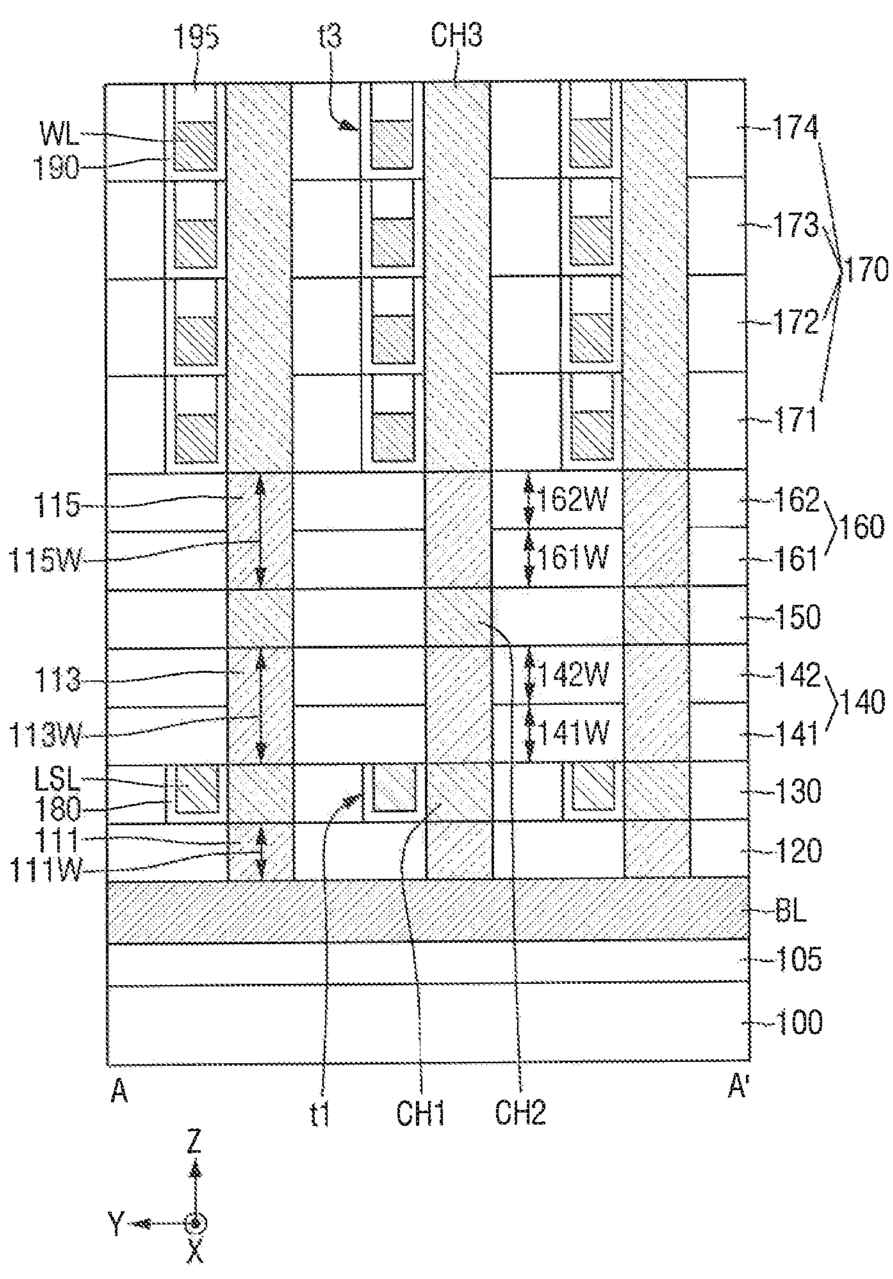
FIG. 5 is a cross-sectional view taken along line A-A' of FIG. 4.
Figure 6:
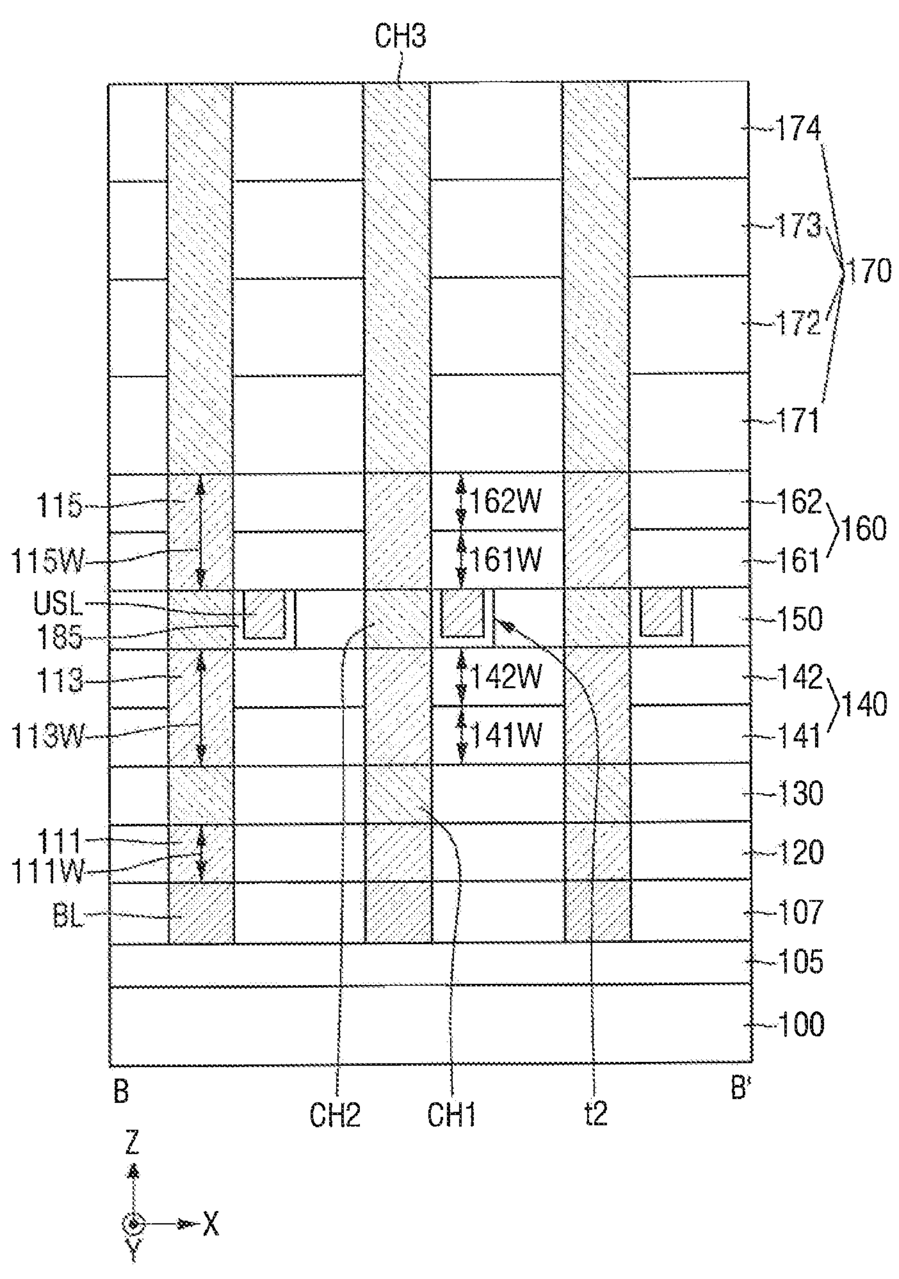
FIG. 6 is a cross-sectional view taken along line B-B' of FIG. 4.
Figure 7:
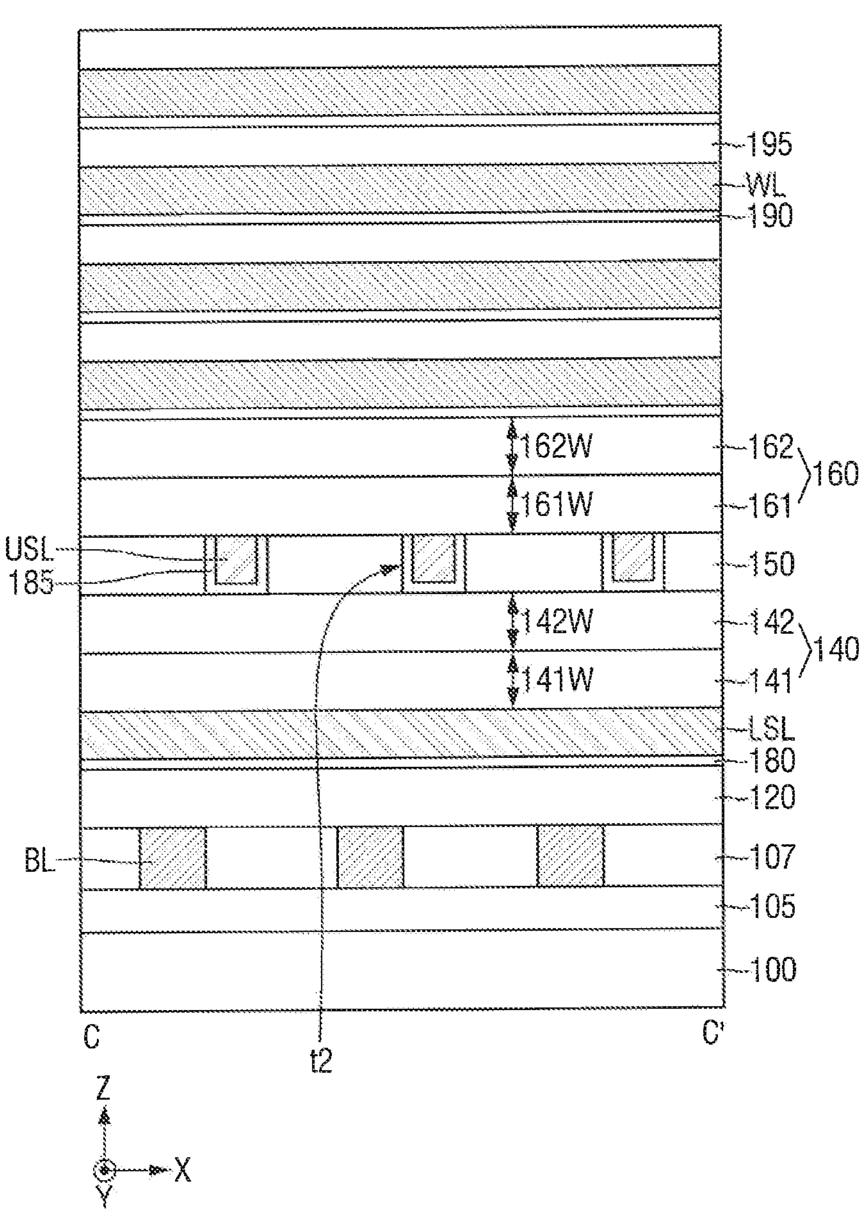
FIG. 7 is a cross-sectional view taken along line C-C' of FIG. 4.

FIG. 4 is a perspective view of a resistive memory device according to an embodiment of the present inventive concept. FIG. 5 is a cross-sectional view taken along line A-A' of FIG. 4. FIG. 6 is a cross-sectional view taken along line B-B' of FIG. 4. FIG. 7 is a cross-sectional view taken along line C-C' of FIG. 4.

Referring to FIGS. 4 to 7, a resistive memory device according to embodiment of the present inventive concept may include a substrate 100, a plurality of column lines BL, a plurality of lower selection lines LSL, a plurality of upper selection lines USL, and a plurality of row lines WL.

The substrate 100 may be a semiconductor substrate. For example, the substrate 100 may include bulk silicon or silicon-on-insulator (SOI). The substrate 100 may be, for example, a silicon substrate, or may include other materials, for example, silicon germanium, indium antimonide, lead telluride, indium arsenide, indium phosphide, gallium arsenide, or gallium antimonide. In addition, the substrate 100 may bean epitaxial layer formed on abase substrate.

A first interlayer insulating film 105 may be provided on the substrate 100. The first interlayer insulating film 105 may include, for example, an oxide-based insulating material. For example, the first interlayer insulating film 105 may include, but is not limited to, at least one of silicon oxide, silicon oxynitride, and a low-k material having a dielectric constant lower than a dielectric constant of silicon oxide.

A plurality of column lines BL may be placed on the substrate 100. The plurality of column lines BL may each extend in the second direction Y. The plurality of column lines BL may be spaced apart from each other in the first direction X. The first direction X and the second direction Y may intersect each other. A third direction Z may intersect the first direction X and the second direction Y. The first direction X, the second direction Y, and the third direction Z may be substantially perpendicular to each other.

Each column line BL may include a conductive material. For example, the column lines BL may each include, but is not limited to, tungsten (W).

In an embodiment of the present inventive concept, an inter-electrode insulating film 107 may be provided between the column lines BL. For example, in FIGS. 6 and 7, the inter-electrode insulating film 107 may fill spaces between the column lines BL. The column lines BL may be electrically separated from each other by the inter-electrode insulating film 107. The inter-electrode insulating film 107 may include, for example, an oxide-based insulating material. For example, the inter-electrode insulating film 107 may include, but is not limited to, at least one of silicon oxide, silicon oxynitride, and/or a low-k material having a dielectric constant lower than the dielectric constant of silicon oxide.

A plurality of row lines WL may be placed on the substrate 100. The plurality of row lines WL may be placed on the column lines BL. Each of the row lines WL may extend in the first direction X. In addition, the row lines WL may be spaced apart from each other in the second direction Y and the third direction Z. In other words, the row lines WL may be arranged three-dimensionally. For example, the row lines WL may be stacked on each other in the third direction Z. As the row lines WL are arranged three-dimensionally, a resistive memory device with increased integration may be provided. The row lines WL may fill a part of a third trench t3. The row lines WL may be surrounded by a resistive insulating film 190 and a capping film 195, which will be described later. For example, the resistive insulating film 190 may extend along side walls and a bottom surface of the row line WL. The capping film 195 may cover the upper surface of the row line WL.

The row lines WL may each include a conductive material. For example, the row lines WL may include, but is not limited to, platinum (Pt).

In the resistive memory device according to an embodiment of the present inventive concept, the column lines BL may function as bit lines, and the row lines WL may function as word lines, but are not limited thereto.

The resistive insulating film 190 may be placed along the bottom surface and inner side walls of the third trench t3. The resistive insulating film 190 may be provided on side walls and the bottom surface of the row line WL. The resistive insulating film 190 may be placed on side walls of the capping film 195. The resistance of the resistive insulating film 190 may change depending on the magnitude of the voltage applied to the row line WL. The resistive insulating film 190 may be switched between different resistance states, depending on the magnitude of the voltage or current applied to both ends of the resistive insulating film 190.

For example, the resistive insulating film 190 may be in a high resistance state or a low resistance state, depending on the magnitude of voltage or current applied to the row line WL and the column line BL. The resistive memory device according to an embodiment of the present inventive concept may store data on the basis of the magnitude of resistance of the resistive insulating film 190.

The resistive insulating film 190 may include metal oxides such as transition metal oxides and perovskite-based materials, and the like. For example, the resistive insulating film 190 may include at least one of $HfO_2$, $TiO_2$, and/or $Ta_2O_5$. However, the present inventive concept is not limited thereto.

A capping film 195 may be placed on the row line WL. The capping film 195 may fill the remaining space of the third trench t3 after the third trench t3 is filled with the resistive insulating film 190 and the row line WL. The capping film 195 may include an oxide-based insulating material. For example, the capping film 195 may include, but is not limited to, silicon oxide.

In FIG. 7, a plurality of upper selection lines USL may be provided between the row line WL and the column line BL. The upper selection lines USL may extend in the second direction Y, respectively. For example, the upper selection lines USL may extend in a direction parallel to the column line BL. However, the upper selection lines USL do not overlap the column lines BL in the third direction Z. The upper selection lines USL do not overlap the column lines BL in the first direction X and the third direction Z. The upper selection lines USL may be spaced apart from each other in the first direction X.

The upper selection lines USL may be provided in a second trench t2. The second trench t2 may extend long in the second direction Y. The upper gate insulating film 185 may be placed along inner side walls and bottom surfaces of the second trenches t2. The upper selection lines USL may be disposed on the upper gate insulating film 185. The upper gate insulating film 185 may be placed along side walls and bottom surfaces of the upper selection lines USL.

In an embodiment of the present inventive concept, the upper selection line USL may be connected to the row line WL and the column line BL. When activating the upper selection line USL, the column line BL and the row line WL may be electrically connected to the upper selection line USL. When the upper selection line USL is deactivated, the column line BL may electrically float. Detailed contents thereof will be provided later.

The upper selection line USL may include a conductive material. For example, the upper selection line USL may include, but is not limited to, tungsten (W). The upper gate insulating film 185 may include an insulating material. For example, the upper gate insulating film 185 may include, but is not limited to, silicon oxide.

In FIG. 5, a plurality of lower selection lines LSL may be provided between the upper selection line USL and the column line BL. Each lower selection line LSL may extend in the first direction X. The lower selection lines LSL may extend in a direction parallel to the row line WL. In addition, the lower selection lines LSL may overlap the row line WL in the third direction Z. In an embodiment of the present inventive concept, when the lower selection line LSL is activated, a current may flow to the column line BL through a first channel layer CH1, which will be described later. When the lower selection line LSL is deactivated, current might not flow through the first channel layer CH1.

The lower selection lines LSL may be placed in the first trench t1. The first trench t1 may extend long in the first direction X. A lower gate insulating film 180 may be placed along inner side walls and a bottom surface of the first trench t1. The lower selection lines LSL may be disposed on the lower gate insulating film 180. The lower gate insulating film 180 may be placed along side walls and a bottom surface of the lower selection line LSL.

The lower selection line LSL may include a conductive material. For example, the lower selection line LSL may include, but is not limited to, tungsten (W). The lower gate insulating film 180 may include an insulating material. For example, the lower gate insulating film 180 may include, but is not limited to, silicon oxide.

The resistive memory device according to an embodiment of the present inventive concept may further include a first channel layer CH1, a second channel layer CH2, a third channel layer CH3, a first impurity region 111, a second impurity region 113, and a third impurity region 115.

The first impurity region 111 and the second impurity region 113 may be provided on both sides of the lower selection line LSL. The first impurity region 111 and the second impurity region 113 may be provided on both sides of the first channel layer CH1 in the third direction Z. The lower selection line LSL may be provided between the first impurity region 111 and the second impurity region 113. The first impurity region 111 may be placed on one side of the lower selection line LSL. The second impurity region 113 may be placed on the other side of the lower selection line LSL. The first impurity region 111 and the second impurity region 113 may be spaced apart from each other in the third direction Z. The first impurity region 111 and the second impurity region 113 may be spaced apart from each other in the third direction Z with the lower selection line LSL interposed therebetween.

The first impurity region 111 and the second impurity region 113 may be a source/drain of the lower selection line LSL. For example, the first impurity region 111 and the second impurity region 113 may be polysilicon containing impurities. For example, the first impurity region 111 and the second impurity region 113 may be doped with n-type impurities, but the present inventive concept is not limited thereto.

In an embodiment of the present inventive concept, a thickness 111W of the first impurity region 111 may be different from a thickness 113W of the second impurity region 113. For example, the thickness 111W of the first impurity region 111 may be smaller than a thickness 113W of the second impurity region 113. However, the present inventive concept is not limited thereto.

The first channel layer CH1 may be interposed between the first impurity region 111 and the second impurity region 113. The first channel layer CH1 may function as a channel of the lower selection line LSL. The first channel layer CH1 may include, but is not limited to, polysilicon. When the lower selection line LSL is activated, current may flow through the first channel layer CH1. When a voltage is applied to the lower selection line LSL, current may flow through the first channel layer CH1. A direction of the current may be the third direction Z. The direction of the current may be a direction substantially perpendicular to the upper side of the substrate 100.

In an embodiment of the present inventive concept, the second impurity region 113 and the third impurity region 115 may be provided on both sides of the upper selection line USL in the third direction Z. The second impurity region 113 and the third impurity region 115 may be provided on both sides of the second channel layer CH2 in the third direction Z. The upper selection line USL may be provided between the second impurity region 113 and the third impurity region 115. The second impurity region 113 may be placed on one side of the upper selection line USL. The third impurity region 115 may be placed on the other side of the upper selection line USL. The second impurity region 113 and the third impurity region 115 may be spaced apart from each other in the third direction Z. The second impurity region 113 and the third impurity region 115 may be spaced apart from each other in the third direction Z with the upper selection line USL interposed therebetween.

The second impurity region 113 and the third impurity region 115 may be the source/drain of the upper selection line USL. The third impurity region 115 may be, for example, polysilicon containing impurities. For example, the third impurity region 115 may be doped with n-type impurities, but is not limited thereto.

In an embodiment of the present inventive concept, a part of the source/drain of the upper selection line USL may be shared with a part of the source/drain of the lower selection line LSL. For example, the second impurity region 113 may function as the source of the upper selection line USL, and may function as the drain of the lower selection line LSL at the same time. In addition, the second impurity region 113 may function as the drain of the upper selection line USL, and may function as the source of the lower selection line LSL at the same time. However, the present inventive concept is not limited thereto.

In an embodiment of the present inventive concept, a thickness 113W of the second impurity region 113 may be substantially the same as a thickness 115W of the third impurity region 115.

A second channel layer CH2 may be interposed between the second impurity region 113 and the third impurity region 115. The second channel layer CH2 may function as a channel of the upper selection line USL. The second channel layer CH2 may include, but is not limited to, polysilicon. When the upper selection line USL is activated, current may flow through the second channel layer CH2. When a voltage is applied to the upper selection line USL, a current may flow through the second channel layer CH2. The direction of current may be the third direction Z. The direction of current may be a direction substantially perpendicular to the upper side of the substrate 100.

The third channel layer CH3 may be provided on one side of the row line WL. The third channel layer CH3 may be connected to the row line WL. The third channel layer CH3 may extend in the third direction Z. Each third channel layer CH3 may be provided in an island shape. For example, each third channel layer CH3 may be spaced apart from each other in the second direction Y and the first direction X. The third channel layers CH3 may function as channels of the low line WL. The third channel layer CH3 may include, but is not limited to, polysilicon. As an example, the third channel layer CH3 may be polysilicon doped with n-type impurities.

The resistive memory device according to an embodiment of the present inventive concept may further include a second interlayer insulating film 120, a third interlayer insulating film 130, a fourth interlayer insulating film 140, a fifth interlayer insulating film 150, a sixth interlayer insulating film 160, and a seventh interlayer insulating film 170.

The second interlayer insulating film 120 may be placed on the column line BL. The second interlayer insulating film 120 may be placed on the inter-electrode insulating film 107. The second interlayer insulating film 120 may be interposed between the lower selection line LSL and the column line BL. The second interlayer insulating film 120 may wrap or at least partially surround the first impurity region 111. In an embodiment of the present inventive concept, the second interlayer insulating film 120 may function as an etching stop film in the process of forming the lower selection line LSL. The second interlayer insulating film 120 may include, for example, a nitride-based insulating material. For example, the second interlayer insulating film 120 may include, but is not limited to, silicon nitride.

The third interlayer insulating film 130 may be provided on the second interlayer insulating film 120. The third interlayer insulating film 130 may wrap or at least partially surround the first channel layer CH1. The third interlayer insulating film 130 may wrap or at least partially surround the lower selection line LSL. The third interlayer insulating film 130 may be placed at substantially the same level as the lower selection line LSL. For example, an upper surface of the third interlayer insulating film 130 may be coplanar with an upper surface of the lower selection line LSL. The third interlayer insulating film 130 may include, for example, an oxide-based insulating material. For example, the third interlayer insulating film 130 may include, but is not limited to, silicon oxide.

The fourth interlayer insulating film 140 may be placed on the third interlayer insulating film 130. The fourth interlayer insulating film 140 may wrap or at least partially surround the second impurity region 113. The fourth interlayer insulating film 140 may be placed between the upper selection line USL and the lower selection line LSL.

In an embodiment of the present inventive concept, the fourth interlayer insulating film 140 may include a first sub-interlayer insulating film 141 and a second sub-interlayer insulating film 142. The second sub-interlayer insulating film 142 may be placed on the first sub-interlayer insulating film 141. In an embodiment of the present inventive concept, a thickness 141W of the first sub-interlayer insulating film 141 may be substantially equal to a thickness 142W of the second sub-interlayer insulating film 142, but the present inventive concept is not limited thereto.

In an embodiment of the present inventive concept, the second sub-interlayer insulating film 142 may function as an etching stop film in the process of forming the upper selection line USL. The first sub-interlayer insulating film 141 may include, for example, an oxide-based insulating material. The second sub-interlayer insulating film 142 may include, for example, a nitride-based insulating material. For example, the first sub-interlayer insulating film 141 may include silicon oxide, and the second sub-interlayer insulating film 142 may include silicon nitride, but the present inventive concept is not limited thereto.

The fifth interlayer insulating film 150 may be placed on the fourth interlayer insulating film 140. The fifth interlayer insulating film 150 may wrap or at least partially surround the second channel layer CH2. The fifth interlayer insulating film 150 may wrap or at least partially surround the upper selection line USL. The fifth interlayer insulating film 150 may be placed at substantially the same level as the upper selection line USL. For example, an upper surface of the fifth interlayer insulating film 150 may be coplanar with an upper surface of the upper selection line USL. The fifth interlayer insulating film 150 may include, for example, an oxide-based insulating material. For example, the fifth interlayer insulating film 150 may include, but is not limited to, silicon oxide.

The sixth interlayer insulating film 160 may be placed on the fifth interlayer insulating film 150. The sixth interlayer insulating film 160 may wrap or at least partially surround the third impurity region 115. The sixth interlayer insulating film 160 may be placed between the row line WL and the upper selection line USL. In an embodiment of the present inventive concept, the sixth interlayer insulating film 160 may include a third sub-interlayer insulating film 161 and a fourth sub-interlayer insulating film 162. The fourth sub-interlayer insulating film 162 may be placed on the third sub-interlayer insulating film 161.

In an embodiment of the present inventive concept, a thickness 161W of the third sub-interlayer insulating film 161 may be substantially equal to a thickness 162W of the fourth sub-interlayer insulating film 162, but the present inventive concept is not limited thereto. In an embodiment of the present inventive concept, the fourth sub-interlayer insulating film 162 may function as an etching stop film in the process of forming the row line WL. The third sub-interlayer insulating film 161 may include, for example, an oxide-based insulating material. The fourth sub-interlayer insulating film 162 may include, for example, a nitride-based insulating material. For example, the third sub-interlayer insulating film 161 may include silicon oxide, and the fourth sub-interlayer insulating film 162 may include silicon nitride, but the present inventive concept is not limited thereto.

The seventh interlayer insulating film 170 may be placed on the sixth interlayer insulating film 160. The seventh interlayer insulating film 170 may wrap or at least partially surround the row lines WL. The seventh interlayer insulating film 170 may wrap or at least partially surround the third channel layers CH3. In an embodiment of the present inventive concept, the seventh interlayer insulating film 170 may include first to fourth portions 171, 172, 173 and 174. The first to fourth portions 171, 172, 173 and 174 may overlap the respective row lines WL in the second direction Y. For example, when four row lines WL are provided in the third direction Z, the seventh interlayer insulating film 170 may be divided into four portions. When n row lines WL are provided in the third direction Z, the seventh interlayer insulating film 170 may also be divided into n portions. However, the present inventive concept is not limited thereto.

Various embodiments of the resistive memory device of the present inventive concept will be described below with reference to FIGS. 8 to 11. FIGS. 8 to 11 are diagrams of the resistive memory device according to an embodiment of the present inventive concept. For convenience of explanation, the explanation will focus on points that are different from those explained using FIGS. 4 to 7. For reference, FIGS. 8 to 11 may be example cross-sectional views taken along line A-A' of FIG. 4.

Figure 8:
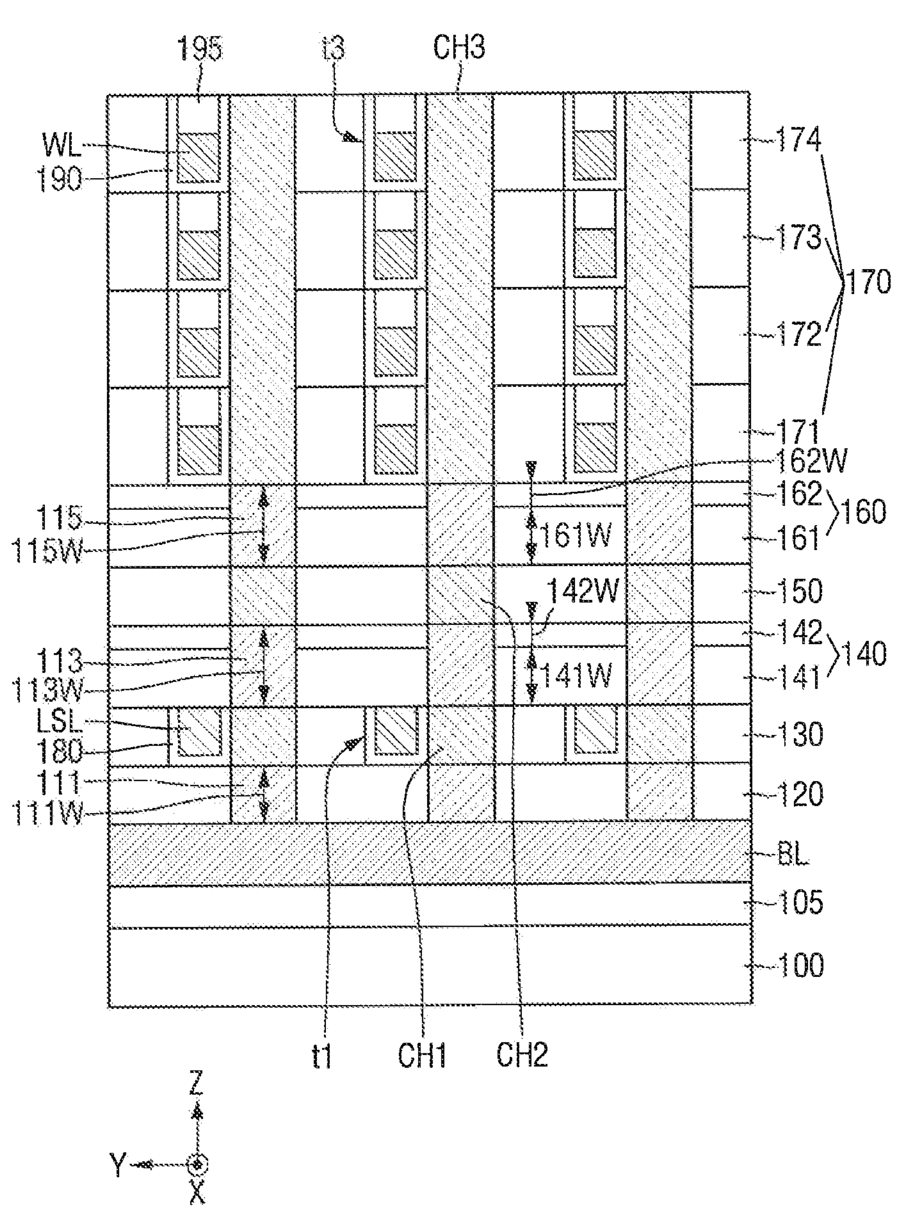
FIGS. 8, 9, 10 and 11 are diagrams of the resistive memory device according to an embodiment of the present inventive concept.

First, referring to FIG. 8, the thickness 141W of the first sub-interlayer insulating film 141 may be different from the thickness 142W of the second sub-interlayer insulating film 142. The thickness 161W of the third sub-interlayer insulating film 161 may be different from the thickness 162W of the fourth sub-interlayer insulating film 162.

For example, the thickness 141W of the first sub-interlayer insulating film 141 may be greater than the thickness 142W of the second sub-interlayer insulating film 142. The thickness 161W of the third sub-interlayer insulating film 161 may be greater than the thickness 162 W of the fourth sub-interlayer insulating film 162.

The thicknesses 142W and 162W of the second sub-interlayer insulating film 142 and the fourth sub-interlayer insulating film 162, which include, for example, a nitride-based insulating material and function as etching stop films, may be smaller than the thicknesses 141W and 161W of the first sub-insulating film 141 and the third sub-interlayer insulating film 161 which include, for example, an oxide-based insulating material.

As the thickness 142W of the second sub-interlayer insulating film 142 decreases, the thickness 113W of the second impurity region 113 may also decrease. In addition, as the thickness 162W of the fourth sub-interlayer insulating film 162 decreases, the thickness 115W of the third impurity region 115 may also decrease. Accordingly, a resistive memory device having increased efficiency may be fabricated.

Figure 9:
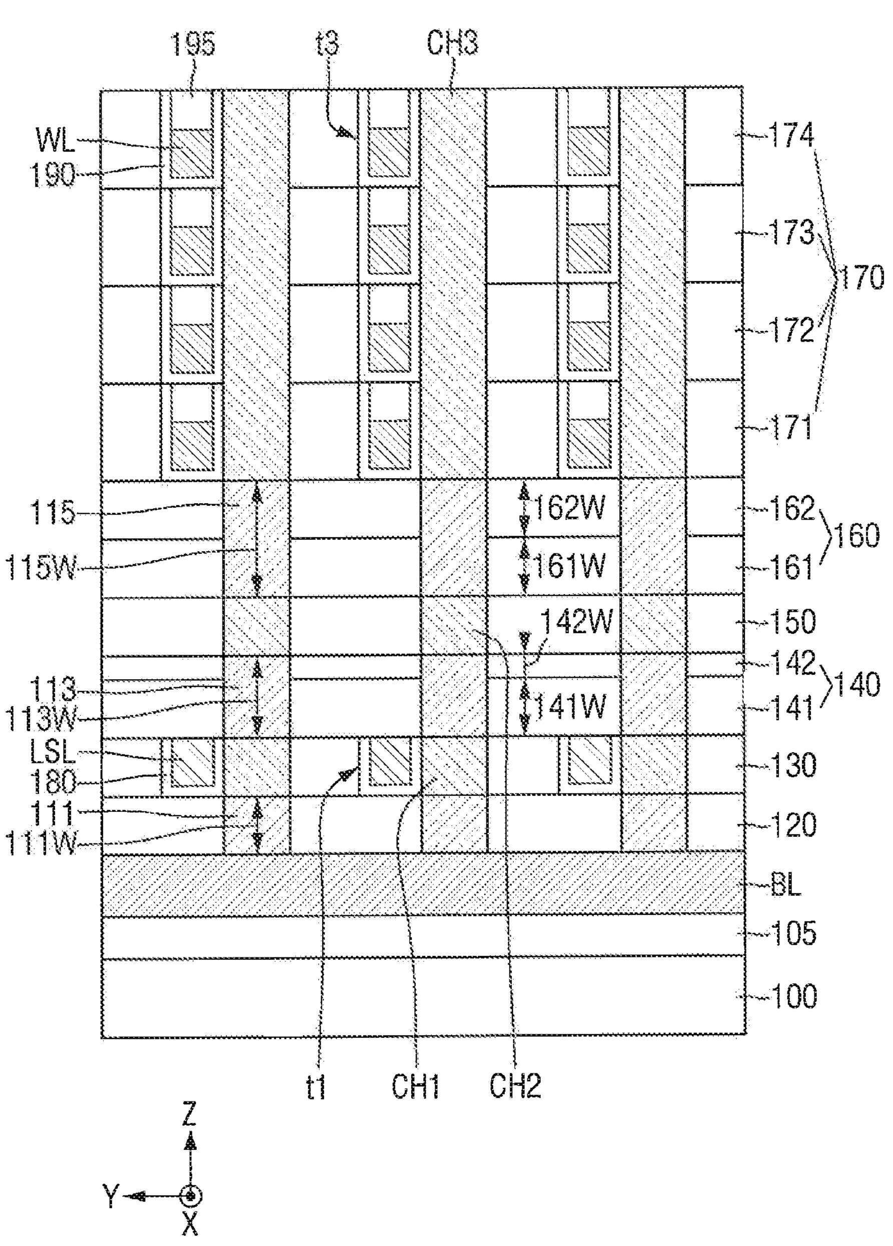

Referring to FIG. 9, the thickness 141W of the first sub-interlayer insulating film 141 may be different from the thickness 142W of the second sub-interlayer insulating film 142. The thickness 161W of the third sub-interlayer insulating film 161 may be the same as the thickness 162W of the fourth sub-interlayer insulating film 162. For example, the thickness 161W of the third sub-interlayer insulating film 161 may be greater than the thickness 162 W of the fourth sub-interlayer insulating film 162.

Accordingly, the thickness 113W of the second impurity region 113 may be different from the thickness 115W of the third impurity region 115. For example, the thickness 113W of the second impurity region 113 may be smaller than the thickness 115W of the third impurity region 115, but the present inventive concept is not limited thereto. For example, the thickness 113W of the second impurity region 113 may be substantially equal to the thickness 115W of the third impurity region 115. The thickness 111W of the first impurity region 111 is smaller than the thickness 113W of the second impurity region 113. The thickness 113W of the second impurity region 113 is smaller than the thickness 115W of the third impurity region 115.

Figure 10:
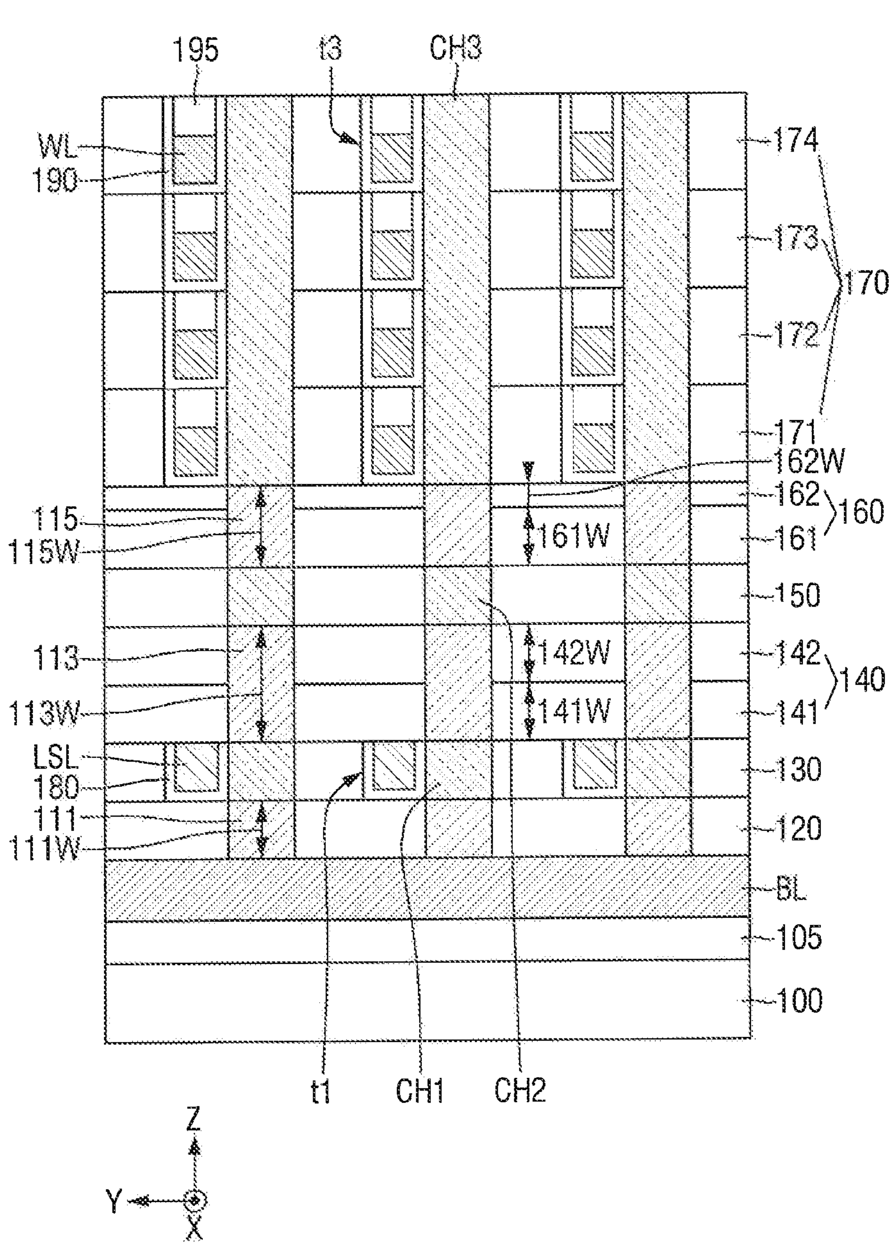

Referring to FIG. 10, the thickness 141W of the first sub-interlayer insulating film 141 may be substantially the same as the thickness 142W of the second sub-interlayer insulating film 142. The thickness 161W of the third sub-interlayer insulating film 161 may be different from the thickness 162W of the fourth sub-interlayer insulating film 162. For example, the thickness 141W of the first sub-interlayer insulating film 141 may be greater than the thickness 142W of the second sub-interlayer insulating film 142.

Accordingly, the thickness 113W of the second impurity region 113 may be different from the thickness 115W of the third impurity region 115. The thickness 113W of the second impurity region 113 may be greater than the thickness 115W of the third impurity region 115, but the present inventive concept is not limited thereto.

Figure 11:
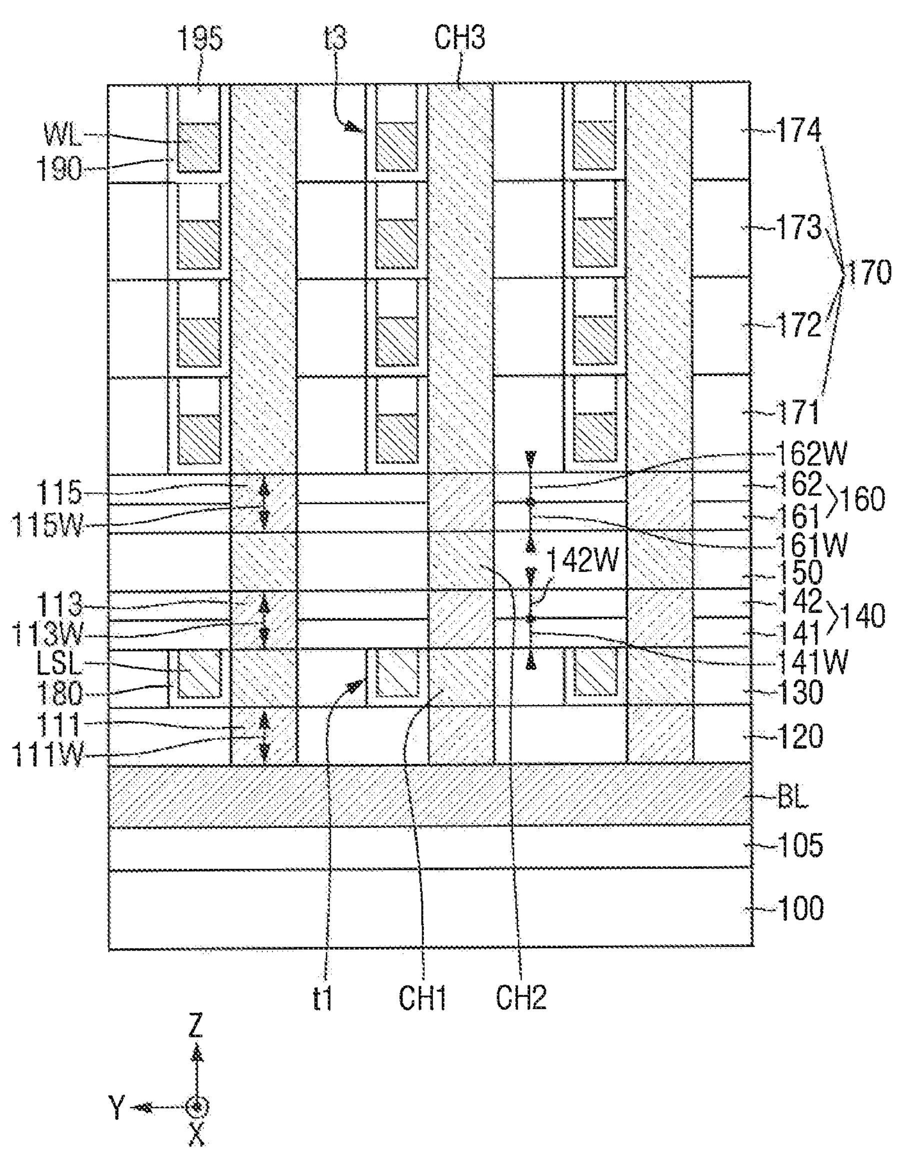

Referring to FIG. 11, the thickness 111W of the first impurity region 111, the thickness 113W of the second impurity region 113, and the thickness 115W of the third impurity region 115 may be substantially the same as each other. The thickness of the second interlayer insulating film 120, the thickness of the fourth interlayer insulating film 140, and the thickness of the sixth interlayer insulating film 160 may be substantially the same as each other.

At this time, the thickness 141W of the first sub-interlayer insulating film 141 is substantially the same as the thickness 142W of the second sub-interlayer insulating film 142, and the thickness 161W of the third sub-interlayer insulating film 161 may be substantially the same as the thickness 162W of the fourth sub-interlayer insulating film 162, but present inventive concept is not limited thereto.

Figure 12:
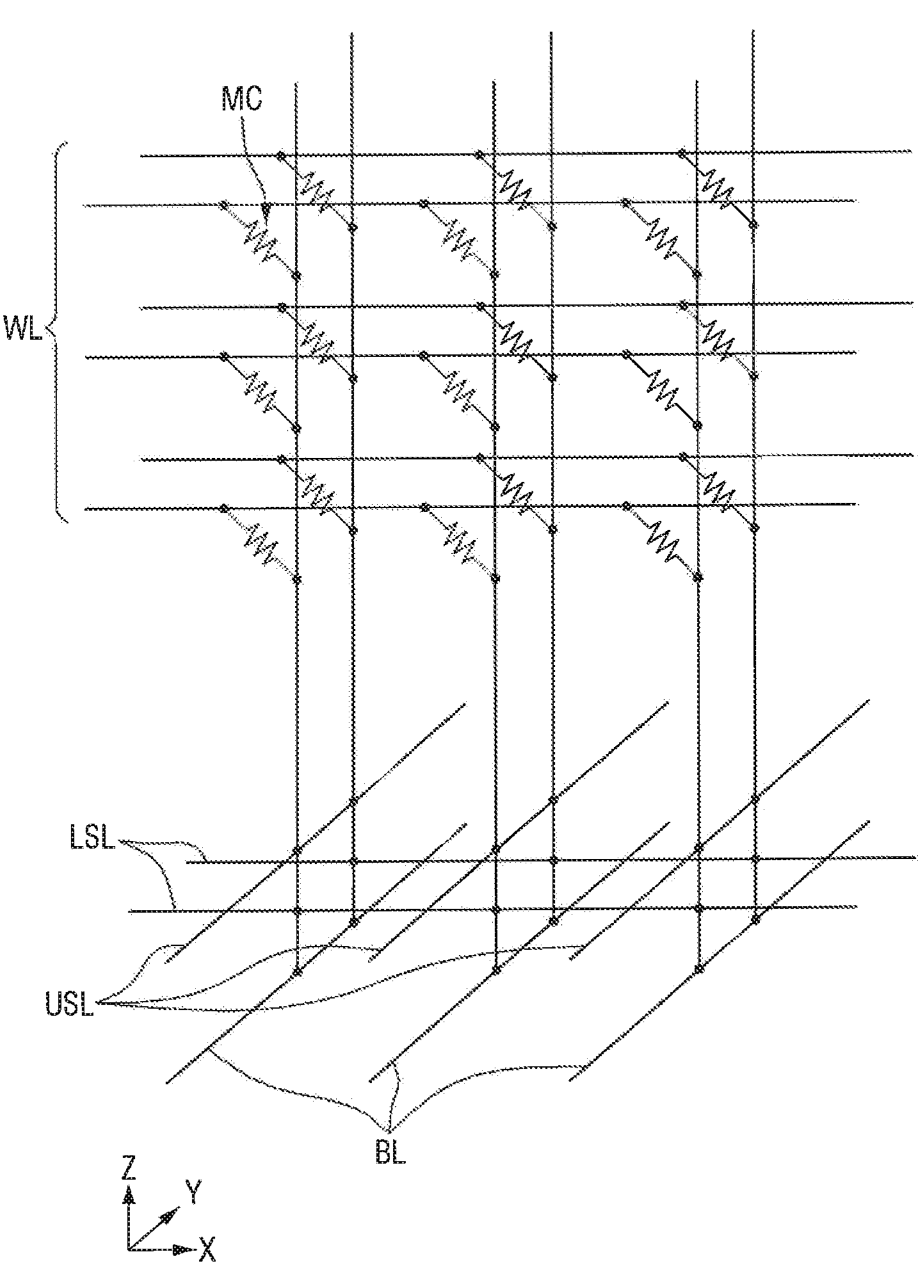
FIG. 12 is a circuit diagram of the resistive memory device according to an embodiment of the present inventive concept.
Figure 13:
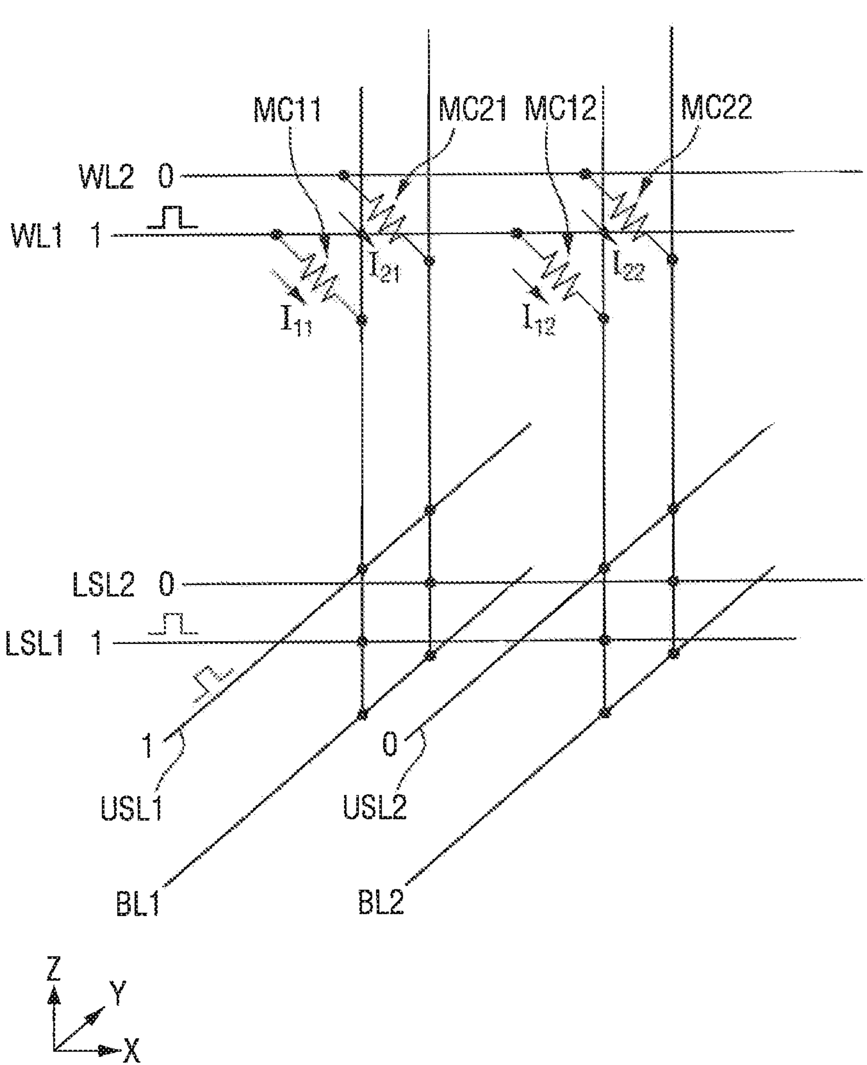
FIG. 13 is a diagram illustrating a method for operating a resistive memory device according to an embodiment of the present inventive concept.

A method for operating a resistive memory device according to an embodiment of the present inventive concept will be described below, using FIGS. 12 and 13. FIG. 12 is a circuit diagram of the resistive memory device according to an embodiment of the present inventive concept. FIG. 13 is a diagram illustrating a method for operating a resistive memory device according to an embodiment of the present inventive concept.

First, referring to FIG. 12, a resistive memory device according to an embodiment of the present inventive concept may include a plurality of row lines WL, a plurality of column lines BL, a plurality of lower selection lines LSL, a plurality of upper selection lines USL, and a plurality of memory cells MC.

The plurality of row lines WL may extend in the first direction X and may be spaced apart from each other in the second direction Y and the third direction Z. The plurality of column lines BL may extend in the second direction Y and be spaced apart from each other in the first direction X. The plurality of upper selection lines USL may extend in the second direction Y and may be spaced apart from each other in the first direction X. The plurality of lower selection lines LSL may extend in the first direction X and may be spaced apart from each other in the second direction Y. The row lines WL may be connected to the upper selection line USL, the lower selection line LSL, and the column line BL.

A plurality of memory cells MC may be formed at intersections between the row line WL and the column line BL. The plurality of memory cells MC may be connected to the row line WL and the column line BL. Each of the plurality of memory cells MC may store data. The plurality of memory cells MC may each be programmed with a first resistance and a second resistance greater than the first resistance. For example, if the memory cell MC is programmed with the second resistance, it may store data '1', and if the memory cell MC is programmed with the first resistance, it may store data '0'. Or, in contrast, if the memory cell MC is programmed with the second resistance, it may store data '0', and if the memory cell MC is programmed with the first resistance, it may store data '1'.

In an embodiment of the present inventive concept, voltage may be applied to the row line WL, the column line BL, the lower selection line LSL, and the upper selection line USL in response to a read command for reading the data stored in the memory cell MC. The lower selection line LSL and the upper selection line USL may be activated or deactivated in response to the read command for reading the data stored in the memory cell MC. For example, the lower selection line LSL and the upper selection line USL connected to the memory cell MC are activated in response to the read command, and the lower selection line LSL and the upper selection line USL not connected to the memory cell MC may be deactivated. Accordingly, a leakage current may decrease, and power consumption may be minimized.

A method for operating a resistive memory device according to an embodiment of the present inventive concept be described below in more detail using FIG. 13.

Referring to FIG. 13, a first row line WL1, a second row line WL2, a first column line BL1, a second column line BL2, a first lower selection line LSL1, a second lower line selection line LSL2, a first upper selection line USL1, a second upper selection line USL2, an eleventh memory cell MC11, a twelfth memory cell MC12, a twenty-first memory cell MC21, and a twenty-second memory cell MC22 are provided.

The first row line WL1 and the second row line WL2 each extend in the first direction X, and are spaced apart from each other in the second direction Y. The first column line BL1 and the second column line BL2 each extend in the second direction Y, and are spaced apart from each other in the first direction X. The first lower selection line LSL1 and the second lower selection line LSL2 each extend in the first direction X, and are spaced apart from each other in the second direction Y. The first upper selection line USL1 and the second upper selection line USL2 each extend in the second direction Y, and are spaced apart from each other in the first direction X.

The eleventh memory cell MC11 is connected to the first row line WL1, the first column line BL1, the first lower selection line LSL1, and the first upper selection line USL1. The twelfth memory cell MC12 is connected to the first row line WL1, the second column line BL2, the first lower selection line LSL1 and the second upper selection line USL2. The twenty-first memory cell MC21 is connected to the second row line WL2, the first column line BL1, the second lower selection line LSL2 and the first upper selection line USL1. The twenty-second memory cell MC22 is connected to the second row line WL2, the second column line BL2, the second lower selection line LSL2, and the second upper selection line USL2.

In response to a read command for reading the data stored in the eleventh memory cell MC11, a first voltage may be applied to the first row line WL1 and a second voltage may be applied to the second row line WL2. For example, the first voltage may be greater than the second voltage, but the present inventive concept is not limited thereto.

In response to the read command for reading the data stored in the eleventh memory cell MC11, a third voltage may be applied to the first column line BL1 and a fourth voltage may be applied to the second column line BL2. For example, the third voltage may be greater than the fourth voltage, but the present inventive concept is not limited thereto.

In response to the read command for reading the data stored in the eleventh memory cell MC11, the first lower selection line LSL1 and the first upper selection line USL1 are activated, and the second lower selection line LSL2 and the second upper selection line USL2 are deactivated.

Accordingly, an eleventh current $I_{11}$ may flow through the eleventh memory cell MC11, an twelfth current $I_{12}$ may flow through the twelfth memory cell MC12, a twenty-first current $I_{21}$ may flow through the twenty-first memory cell MC21, and a twenty-second current $I_{22}$ may flow through the twenty-second memory cell MC22.

In an embodiment of the present inventive concept, as the second lower selection line LSL2 is deactivated, the twenty-first current $I_{21}$ is not received by the first column line BL1. As the second lower selection line LSL2 is deactivated, the twenty-second current $I_{22}$ is not received by the second column line BL2. As the second upper selection line USL2 is deactivated, the twelfth current $I_{12}$ is not received by the second column line BL2.

For example, by activating or deactivating the first and second lower selection lines LSL1 and LSL2 and the first and second upper selection lines USL1 and USL2, only the eleventh current $I_{11}$ may be selectively received by the first column line BL1. Only the current flowing through the selected memory cells may be received. The current flowing through unselected memory cells might not be received. Therefore, the leakage current of the resistive memory device may be reduced. A resistive memory device having increased efficiency may be achieved. Furthermore, power consumption of the resistive memory device according to an embodiment of the present inventive concept may be reduced.

A method for fabricating the resistive memory device according to an embodiment of the present inventive concept will now be described with reference to FIGS. 14 to 43.

FIGS. 14 to 43 are intermediate diagrams illustrating a method for fabricating a resistive memory device according to an embodiment of the present inventive concept.

Figure 14:
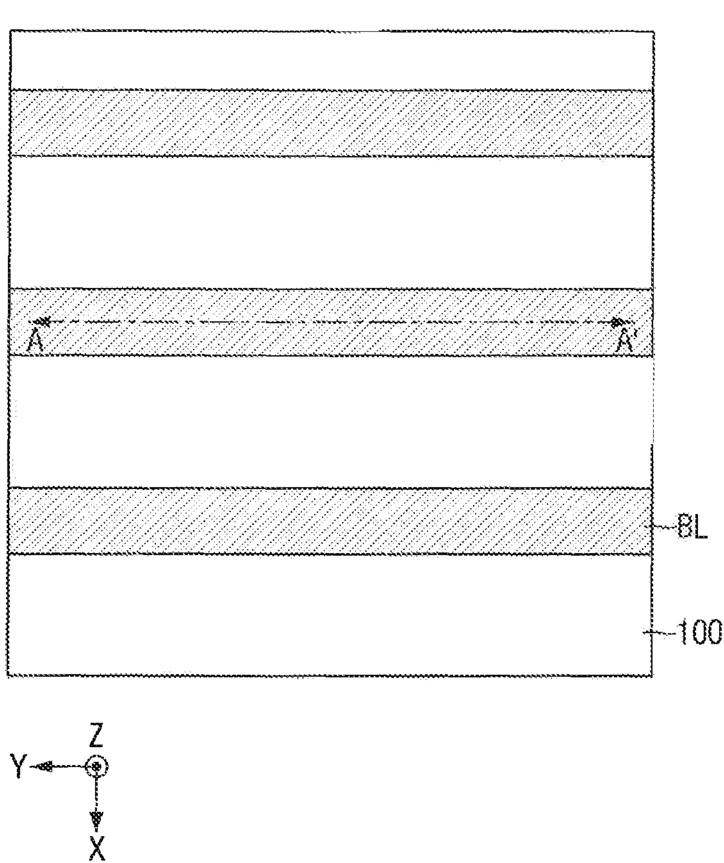
FIGS. 14, 15, 16, 17, 18, 19, 20, 21, 22, 23, 24, 25, 26, 27, 28, 29, 30, 31, 32, 33, 34, 35, 36, 37, 38, 39, 40, 41, 42, and 43 are intermediate diagrams illustrating a method for fabricating a resistive memory device according to an embodiment of the present inventive concept.
Figure 15:
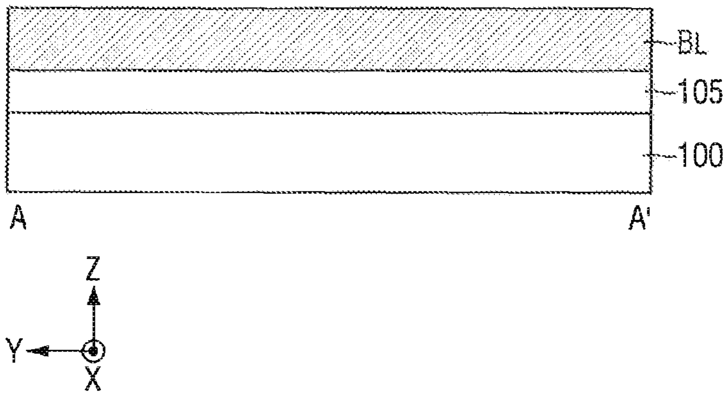

FIG. 14 is a plan view of an intermediate step illustrating the method for fabricating the resistive memory device according to an embodiment of the present inventive concept, and FIG. 15 is a cross-sectional view taken along line A-A' of FIG. 14.

First, referring to FIGS. 14 and 15, a substrate 100 is provided. A first interlayer insulating film 105 may be formed on the substrate 100. A column line BL may be formed on the first interlayer insulating film 105. The column lines BL may extend in the second direction Y and may be spaced apart in the first direction X. An inter-electrode insulating film (107 of FIG. 6) may be formed between the column lines BL.

Figure 16:
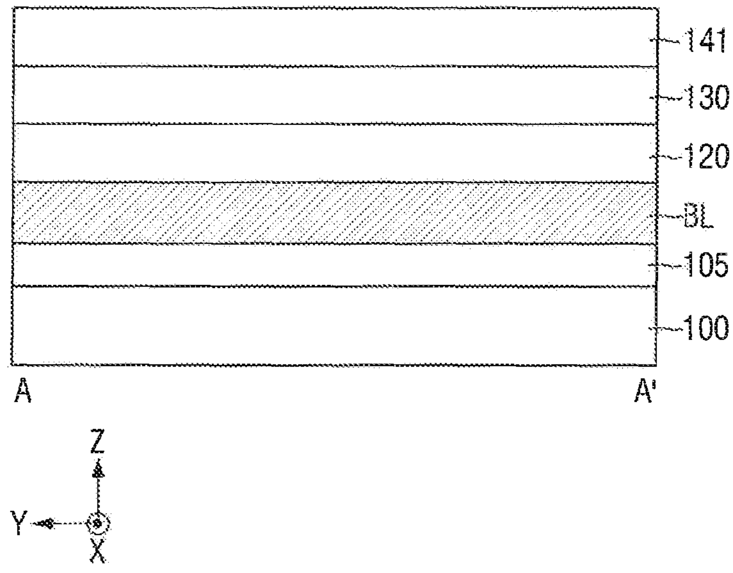

Referring to FIG. 16, a second interlayer insulating film 120, a third interlayer insulating film 130, and a first sub-interlayer insulating film 141 may be sequentially formed on the column line BL. The second interlayer insulating film 120 may include, for example, a nitride-based insulating material. The third interlayer insulating film 130 and the first sub-interlayer insulating film 141 may each include, for example, an oxide-based insulating material.

The second interlayer insulating film 120, the third interlayer insulating film 130, and the first sub-interlayer insulating film 141 are all shown to be formed to have substantially the same thickness, but the present inventive concept is not limited thereto. According to an embodiment of the present inventive concept, the thickness of the second interlayer insulating film 120 may be smaller than the thicknesses of the third interlayer insulating film 130 and the first sub-interlayer insulating film 141.

Figure 17:
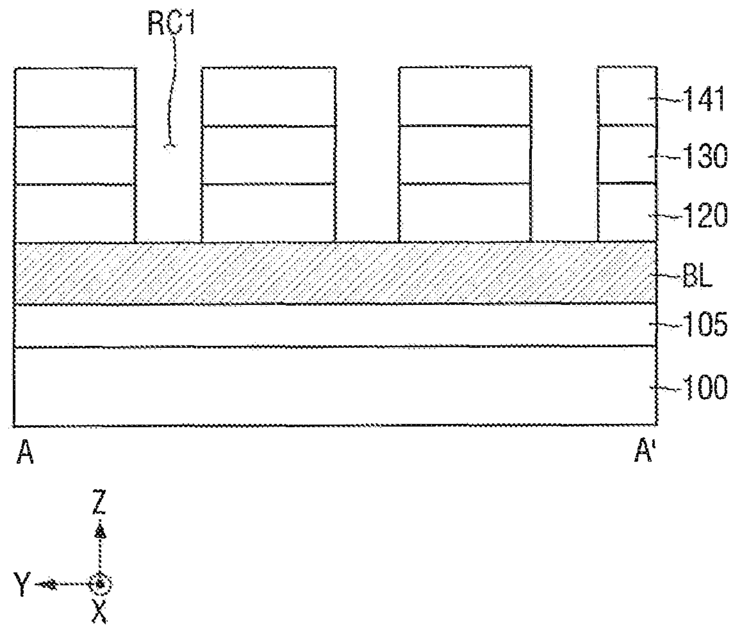

Referring to FIG. 17, a first recess RC1 may be formed. The first sub-interlayer insulating film 141, the third interlayer insulating film 130, and the second inter-layer insulating film 120 may be sequentially etched to form the first recess RC. The first recess RC1 may expose the surface of the column line BL. The first recess RC1 may be formed in an island shape, but the present inventive concept is not limited thereto.

Figure 18:
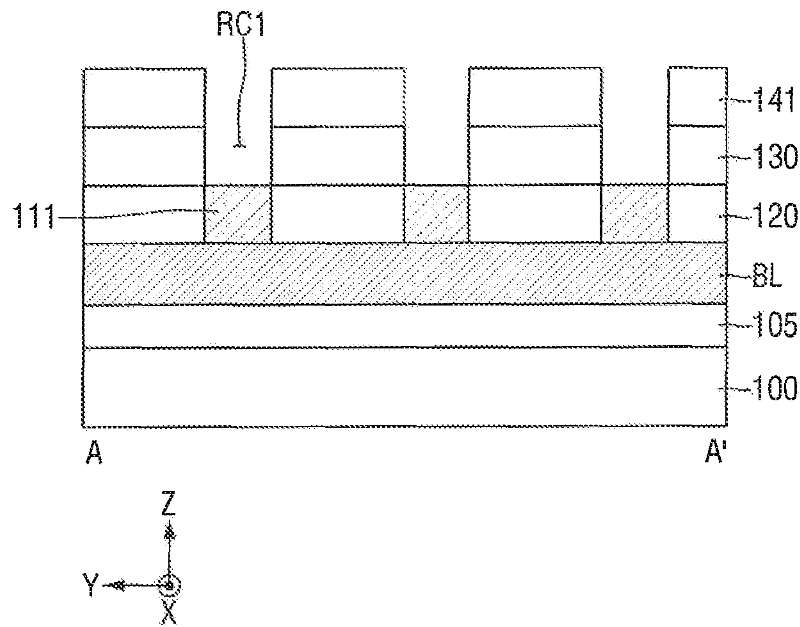

Referring to FIG. 18, a first impurity region 111 may be formed. The first impurity region 111 may fill a part of the first recess RC1.

First, a pre-first impurity region that completely fills the first recess RC1 and covers the first sub-interlayer insulating film 141 may be formed. Subsequently, the first impurity region 11 may be formed by etching the pre-first impurity region. The first impurity region 111 may be polysilicon doped with n-type impurities.

Figure 19:
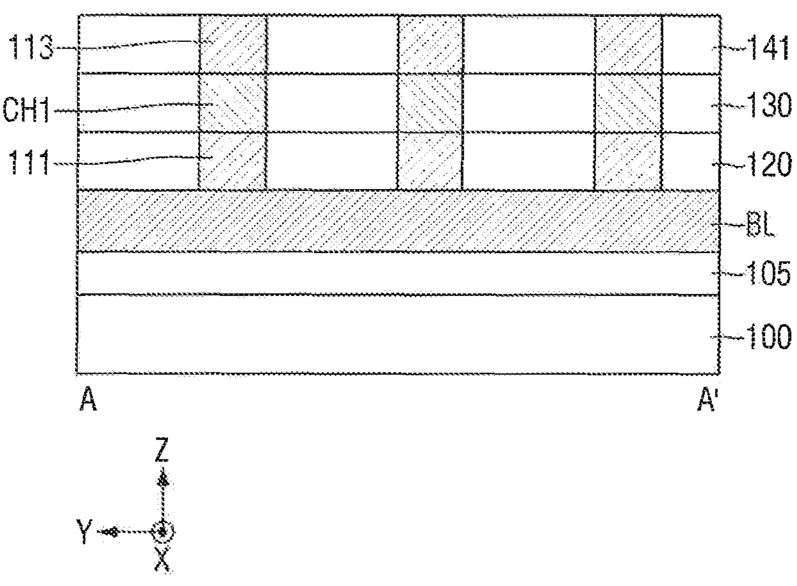

Referring to FIG. 19, a first channel layer CH1 and a second impurity region 113 may be formed. The first impurity region 111, the first channel layer CH1, and the second impurity region 113 may fill the first recess RC1.

First, a pre-first channel layer that fills the first recess RC1 and covers the first sub-interlayer insulating film 141 may be formed on the first impurity region 111. For example, the pre-first channel layer may completely fill the first recess RC. Subsequently, the pre-first channel layer may be etched to form a first channel layer CH1. The first channel layer CH1 may include, for example, polysilicon.

Subsequently, a pre-second impurity region that completely fills the first recess RC1 and covers the first sub-interlayer insulating film 141 may be formed on the first channel layer CH1. Subsequently, the second impurity region 113 may be formed by etching the pre-second impurity region. The second impurity region 113 may be polysilicon doped with n-type impurities.

Figure 20:
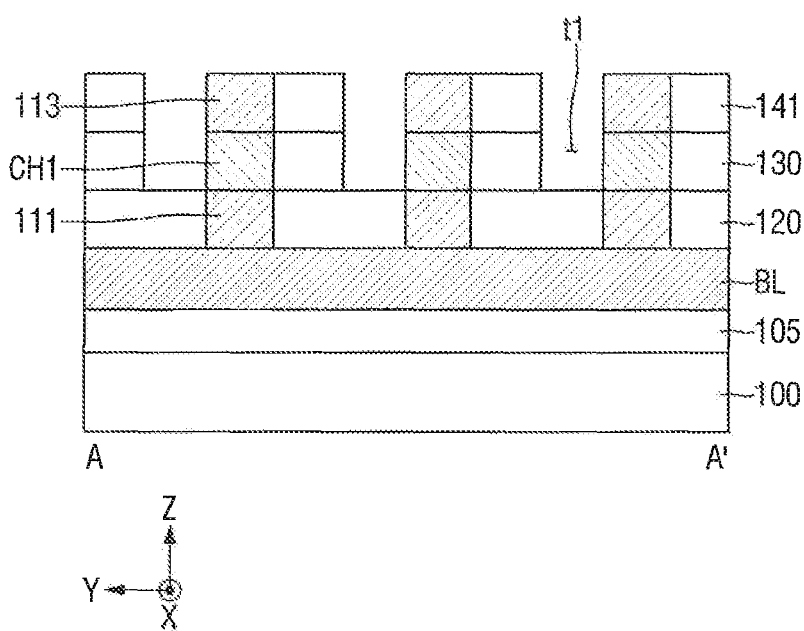

Referring to FIG. 20, a first trench t1 may be formed. The first trench t1 may be formed on one side of the first channel layer CH1 and the second impurity region 113. The first trench t1 may be linearly formed. For example, the first trench t1 may extend in the first direction X.

The first trench t1 may be formed by sequentially etching the first sub-interlayer insulating film 141 and the third inter-layer insulating film 130. The second interlayer insulating film 120 is not etched in the process of forming the first trench t1. The second interlayer insulating film 120 may function as an etching stop film in the process of forming the first trench t1. Since the first sub-interlayer insulating film 141 and the third inter-layer insulating film 130 have an etching selectivity with respect to the second inter-layer insulating film 120, the second interlayer insulating film 120 might not be etched, while the first sub-interlayer insulating film 141 and the third inter-layer insulating film 130 are being etched.

Figure 21:
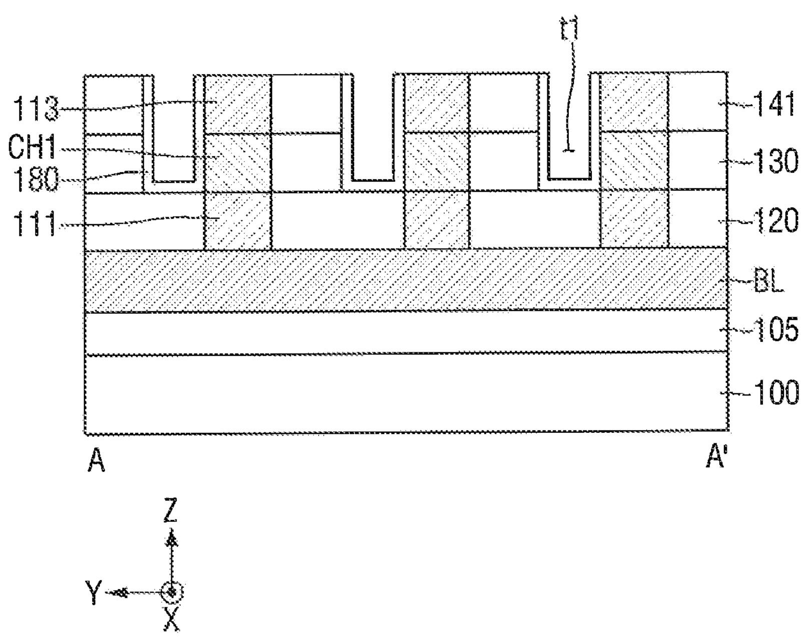

Referring to FIG. 21, a lower gate insulating film 180 may be formed along side walls and a bottom surface of the first trench t1. The lower gate insulating film 180 may be formed, but is not limited to, by an oxidation process. The lower gate insulating film 180 may include, for example, silicon oxide.

Figure 22:
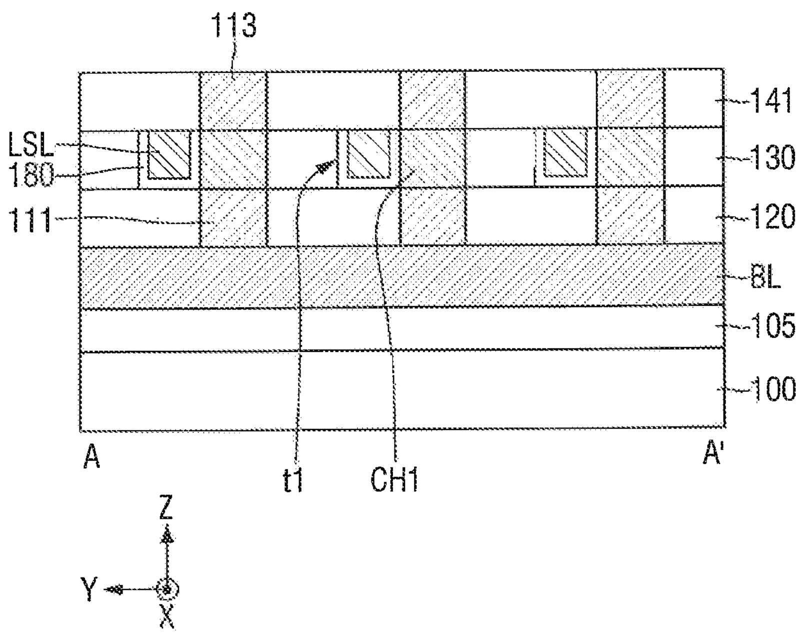

Referring to FIG. 22, a lower selection line LSL may be formed. The lower selection line LSL may fill a part of the first trench t1. The lower selection line LSL may be formed on the lower gate insulating film 180. First, a pre-lower selection line that fills the first trench t1 and covers the first sub-interlayer insulating film 141 may be formed. For example, the pre-lower selection line may completely fill the first trench t1. The pre-lower selection line may then be etched to form the lower selection line LSL. The lower selection line LSL may extend in the first direction X. Subsequently, a silicon oxide film may be formed on the lower selection line LSL.

Figure 23:
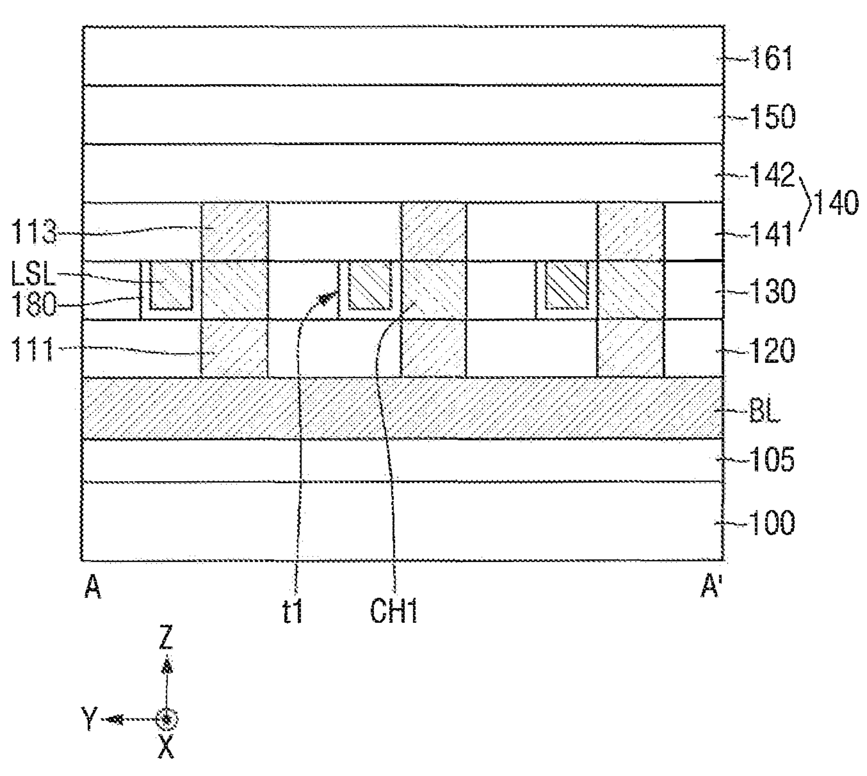

Referring to FIG. 23, a second sub-interlayer insulating film 142, a fifth sub-interlayer insulating film 150 and a third sub-interlayer insulating film 161 may be formed on the first sub-interlayer insulating film 141. The first sub-interlayer insulating film 141 and the second sub-interlayer insulating film 142 may constitute a fourth inter-layer insulating film 140.

The second sub-interlayer insulating film 142 may include, for example, a nitride-based insulating material. The fifth interlayer insulating film 150 and the third sub-interlayer insulating film 161 may each include, for example, an oxide-based insulating material.

The second sub-interlayer insulating film 142, the fifth inter-layer insulating film 150, and the third sub-interlayer insulating film 161 are all shown to be formed to have substantially the same thickness, but the present inventive concept is not limited thereto. According to an embodiment of the present inventive concept, the thickness of the second sub-interlayer insulating film 142 may be smaller than the thicknesses of the fifth sub-interlayer insulating film 150 and the third sub-interlayer insulating film 161.

Figure 24:
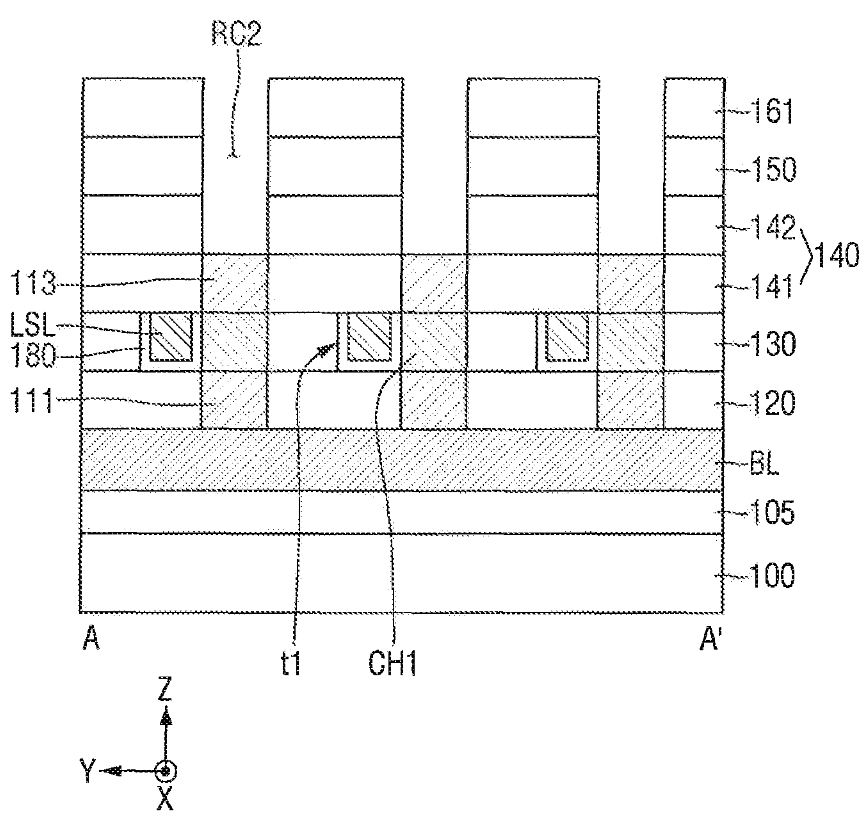

Referring to FIG. 24, a second recess RC2 may be formed. The third sub-interlayer insulating film 161, the fifth sub-interlayer insulating film 150, and the second sub-interlayer insulating film 142 may be sequentially etched to form a second recess RC2. The second recess RC2 may expose the surface of the second impurity region 113. The second recess RC2 may be formed in an island shape, but the present inventive concept is not limited thereto.

Figure 25:
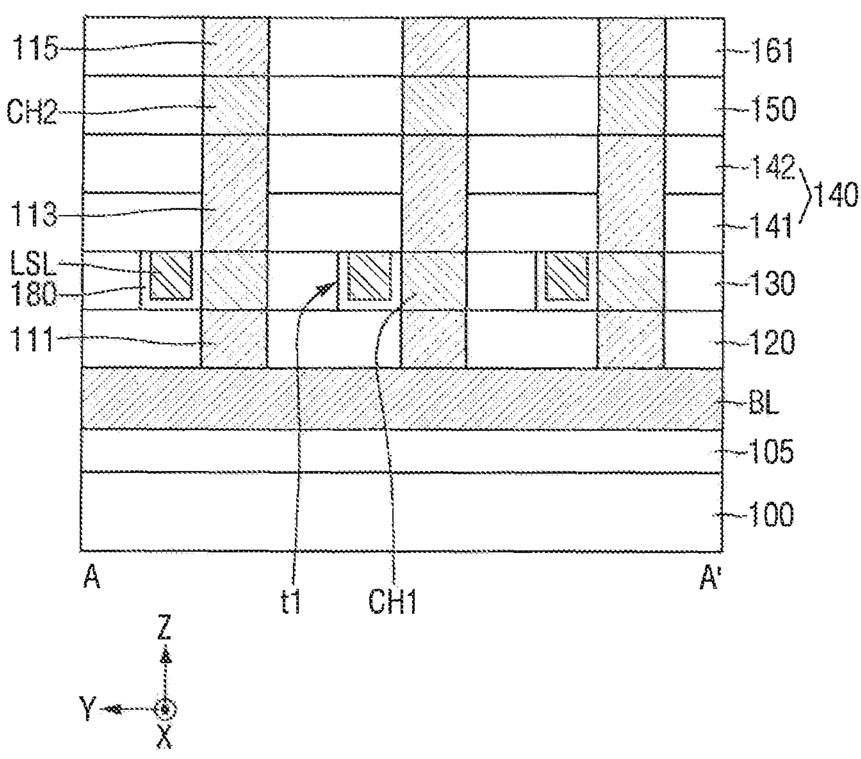

Referring to FIG. 25, a second impurity region 113, a second channel layer CH2, and a third impurity region 115 may be formed. The second impurity region 113, the second channel layer CH2, and the third impurity region 115 may fill the second recess RC2.

First, a pre-second impurity region that fills the second recess RC2 and covers the third sub-interlayer insulating film 161 may be formed. For example, the pre-second impurity region may completely fill the second recess RC2. The pre-second impurity region may be polysilicon doped with n-type impurities. Subsequently, the second impurity region 113 may be formed by etching the pre-second impurity region.

Subsequently, a pre-second channel layer that fills the second recess RC2 and covers the third sub-interlayer insulating film 161 may be formed on the second impurity region 113. For example, the pre-second channel layer may completely fill the second recess RC2. Subsequently, the pre-second channel layer may be etched to form a second channel layer CH2. The second channel layer CH2 may include polysilicon.

Subsequently, a third impurity region that fills the second recess RC2 and covers the third sub-interlayer insulating film 161 may be formed on the second channel layer CH2. For example, the third impurity region may completely fill the second recess RC2. Subsequently, a third impurity region 115 may be formed by etching the third impurity region. The third impurity region 115 may be polysilicon doped with n-type impurities.

Figure 26:
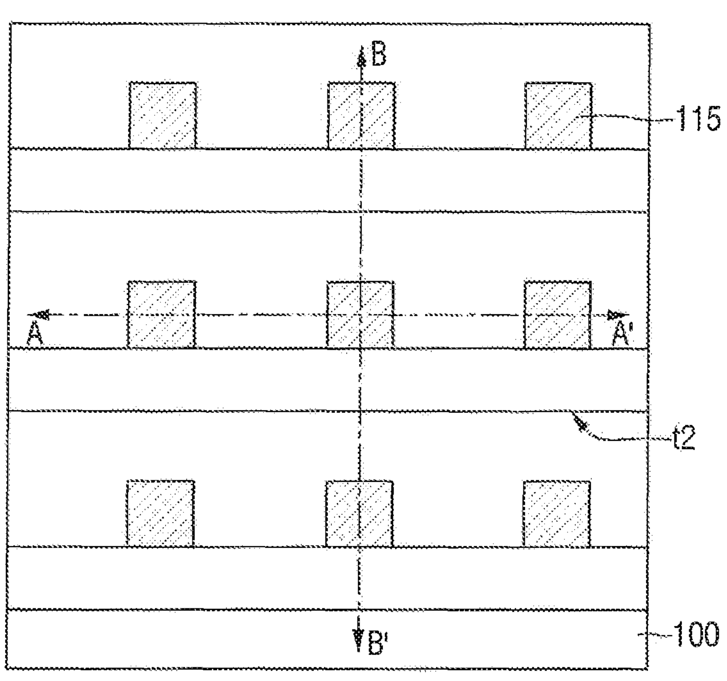
Figure 26:
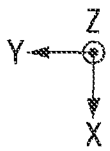
Figure 27:
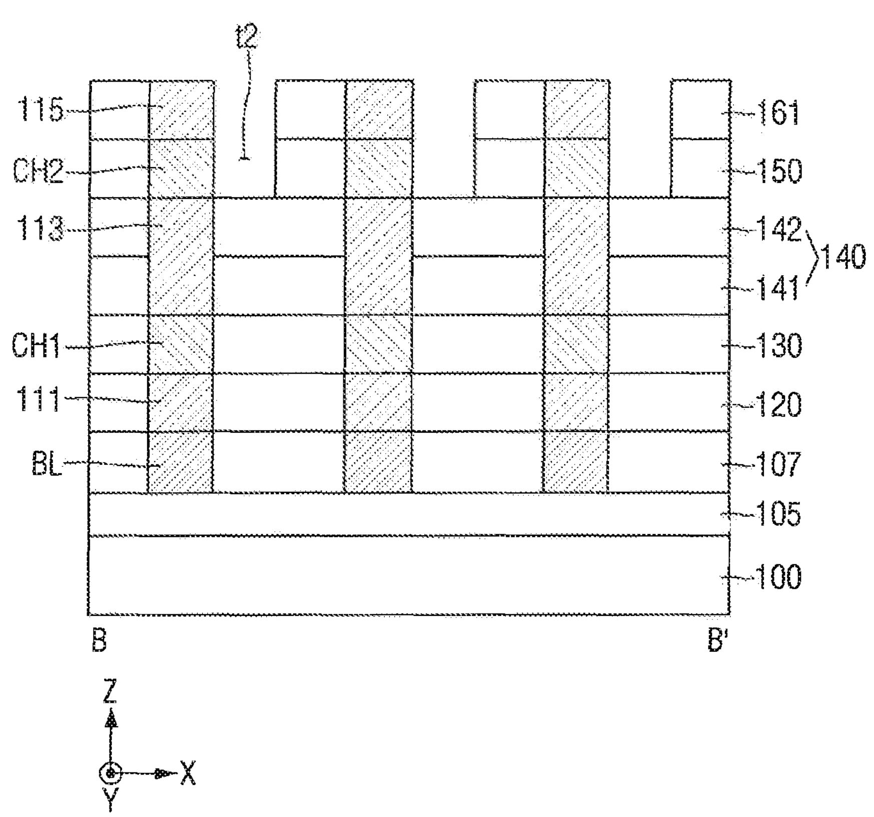

FIG. 26 is a plan view of an intermediate step illustrating the method for fabricating the resistive memory device according to an embodiment of the present inventive concept, and FIG. 27 is a cross-sectional view taken along line B-B' of FIG. 26.

Referring to FIGS. 26 and 27, a second trench t2 may be formed. The second trench t2 may be formed on one side of the second channel layer CH2 and the third impurity region 115. The second trench t2 may be linearly formed. For example, the second trench t2 may extend in the second direction Y.

The second trench t2 may be formed by sequentially etching the third sub-interlayer insulating film 161 and the fifth inter-layer insulating film 150. The second sub-interlayer insulating film 142 is not etched in the process of forming the second trench t2. The second sub-interlayer insulating film 142 may function as an etching stop film in the process of forming the second trench t2. Since the third sub-interlayer insulating film 161 and the fifth inter-layer insulating film 150 have an etching selectivity with the second sub-interlayer insulating film 142, the second sub-interlayer insulating film 142 might not be etched, while the third sub-interlayer insulating film 161 and the fifth inter-layer insulating film 150 are being etched.

Figure 28:
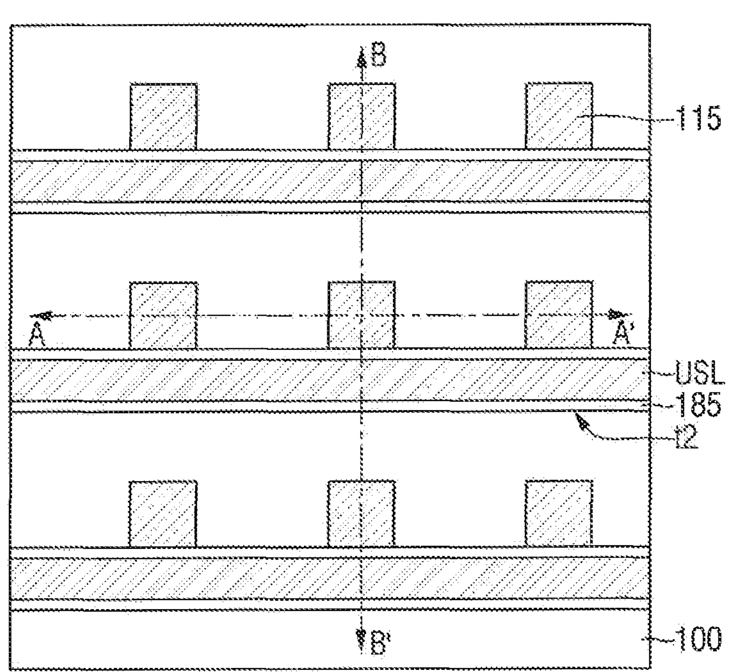
Figure 28:
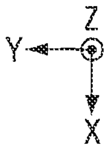
Figure 29:
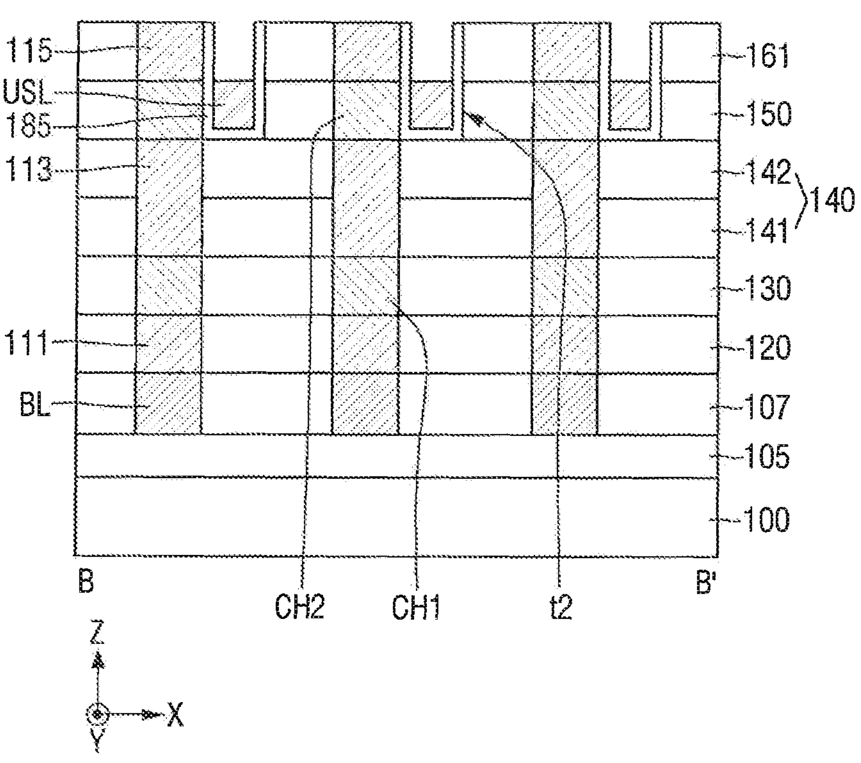

FIG. 28 is a plan view of an intermediate step illustrating a method for fabricating a resistive memory device according to an embodiment of the present inventive concept, and FIG. 29 is a cross-sectional view taken along line B-B' of FIG. 28.

Referring to FIGS. 28 and 29, an upper gate insulating film 185 may be formed along side walls and bottom surface of the second trench t2. The upper gate insulating film 185 may be formed through an oxidation process, but the present inventive concept is not limited thereto. The upper gate insulating film 185 may include, for example, silicon oxide.

After that, the upper selection line USL may be formed. The upper selection line USL may fill the second trench t2. The upper selection line USL may be formed on the upper gate insulating film 185. First, a pre-upper selection line that fills the second trench t2 and covers the third sub-interlayer insulating film 161 is formed. For example, the pre-upper selection line may completely fill the second trench t2. The upper selection line may then be etched to form the upper selection line USL.

The upper selection line USL may extend in the second direction Y. The upper selection line USL extends in a direction parallel to the column line BL. However, the upper selection line USL does not overlap the column line BL in the third direction Z. Since the second trench t2 do not overlap the column line BL in the third direction Z, the upper selection line USL also do not overlap the column line BL in the third direction Z.

Figure 30:
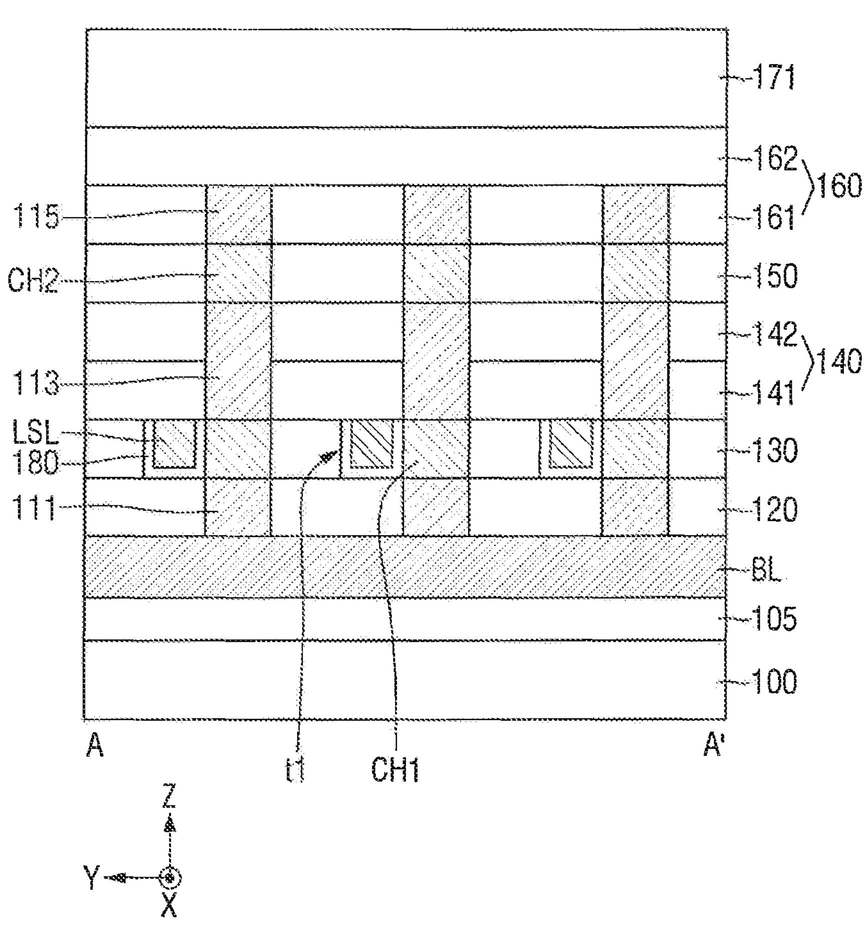

Referring to FIG. 30, a fourth sub-interlayer insulating film 162 and a first portion 171 of the seventh interlayer insulating film may be formed on the third sub-interlayer insulating film 161. The third sub-interlayer insulating film 161 and the fourth sub-interlayer insulating film 162 may constitute a sixth inter-layer insulating film 160.

The fourth sub-interlayer insulating film 162 may include, for example, a nitride-based insulating material. The first portion 171 of the seventh interlayer insulating film may include, for example, an oxide-based insulating material.

Figure 31:
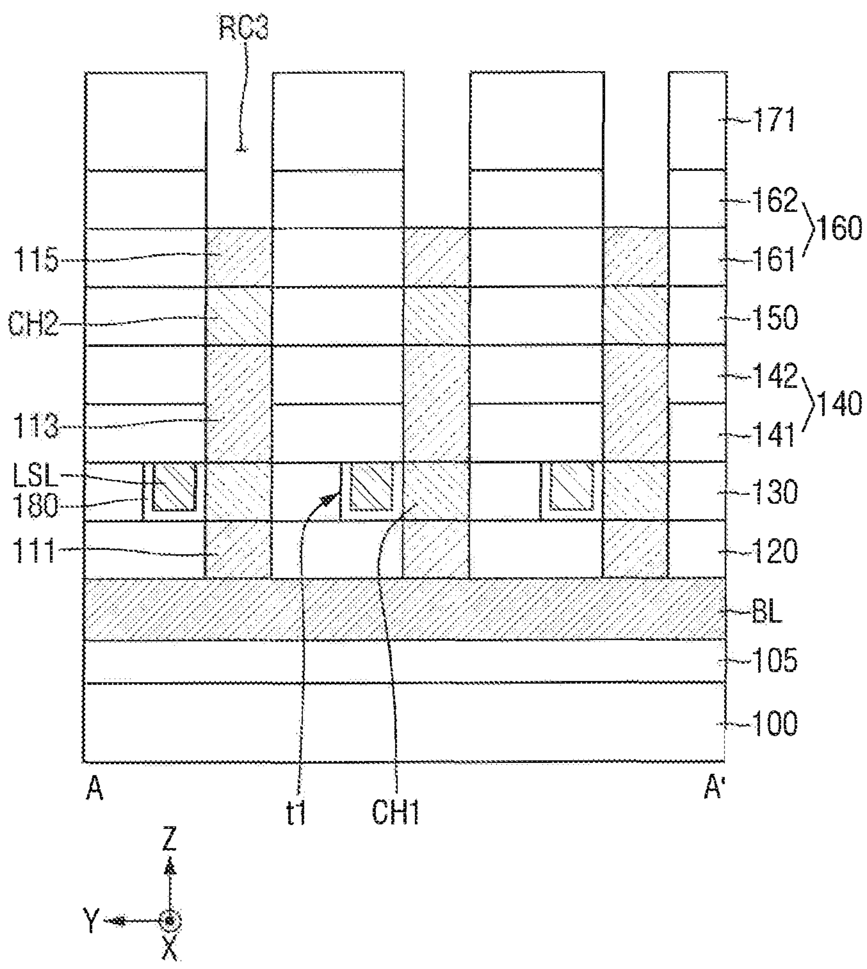

Referring to FIG. 31, a third recess RC3 may be formed. The first portion 171 of the seventh interlayer insulating film and the fourth sub-interlayer insulating film 162 may be sequentially etched to form a third recess RC3. The third recess RC3 may expose the surface of the third impurity region 115. The third recess RC3 may be formed in an island shape, but is not limited thereto. For example, a plurality of third recesses RC3 may be separated from each other.

Figure 32:
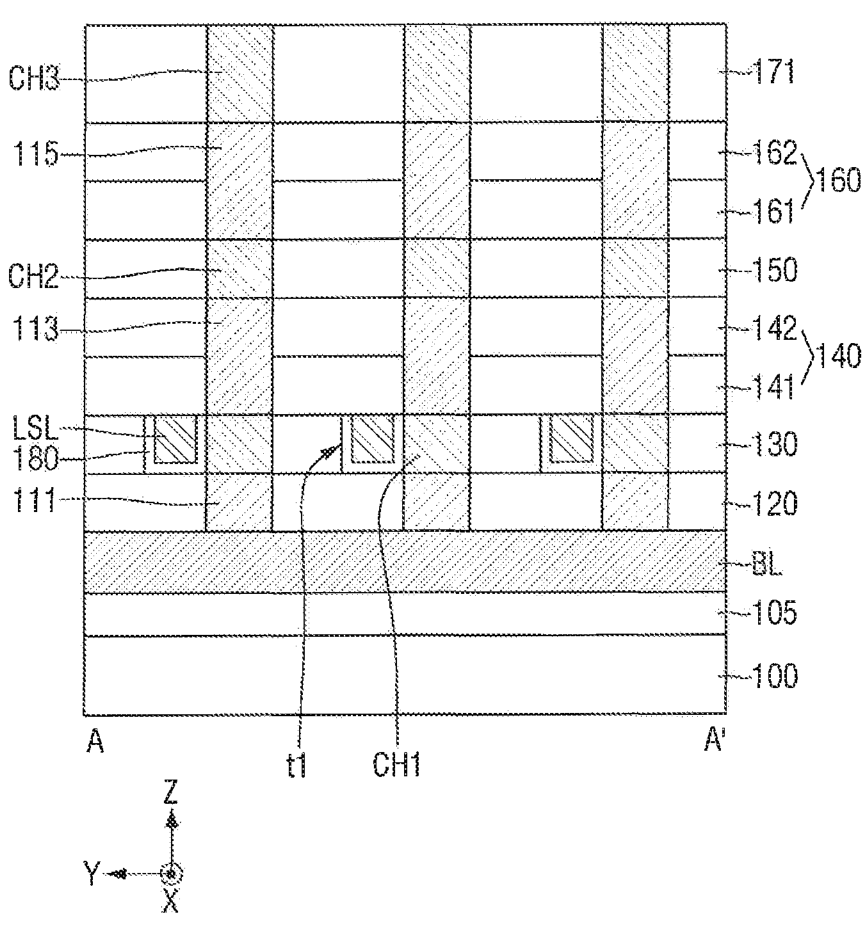

Referring to FIG. 32, a third impurity region 115 and a third channel layer CH3 may be formed. The third impurity region 115 and the third channel layer CH3 may fill the third recess RC3.

First, a pre-third impurity region that fills the third recess RC3 and covers the fourth sub-interlayer insulating film 162 may be formed. For example, the pre-third impurity region may completely fill the third recess RC3. The pre-third impurity region may be polysilicon doped with n-type impurities. Subsequently, the third impurity region 115 may be formed by etching the pre-third impurity region.

Subsequently, a pre-third channel layer that fills the third recess RC3 and covers the fourth sub-interlayer insulating film 162 may be formed on the third impurity region 115. For example, the pre-third channel layer may completely fill the third recess RC3. Subsequently, the pre-third channel layer may be etched to form a third channel layer CH3. The third channel layer CH3 may include, for example, polysilicon.

Figure 33:
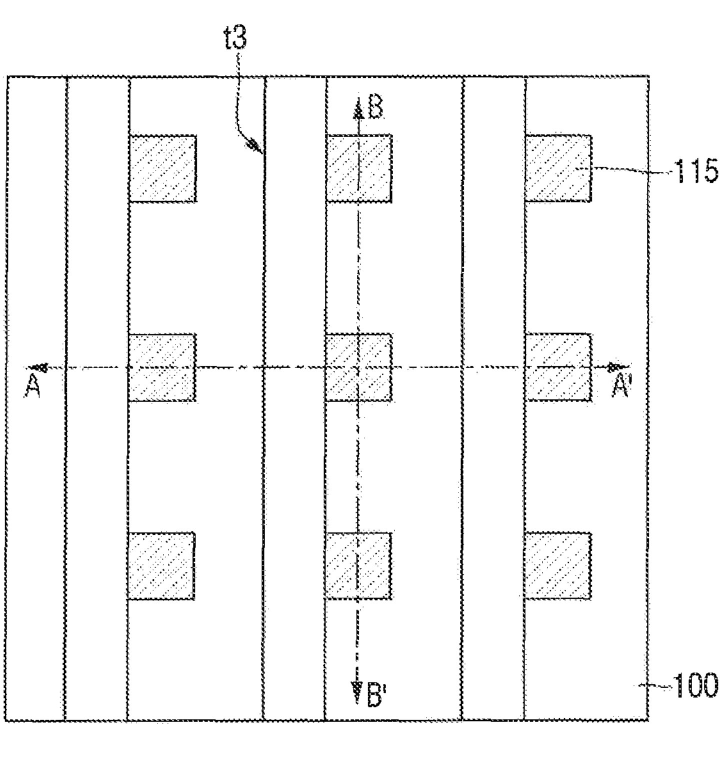
Figure 33:
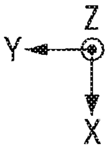
Figure 34:
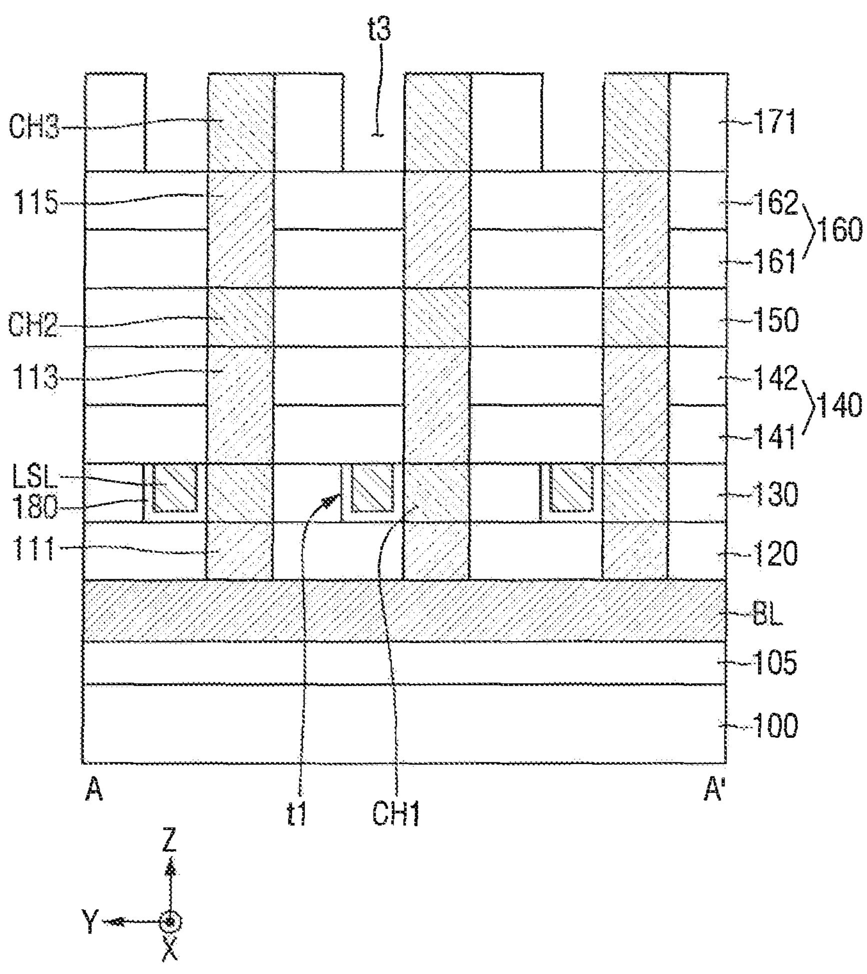

FIG. 33 is a plan view of an intermediate step illustrating a method for fabricating a resistive memory device according to an embodiment of the present inventive concept, and FIG. 34 is a cross-sectional view taken along line A-A' of FIG. 33.

Referring to FIGS. 33 and 34, a third trench t3 may be formed. The third trench t3 may be formed on one side of the third channel layer CH3. The third trench t3 may be linearly formed. For example, the third trench t3 may extend in the first direction X.

The third trench t3 may be formed by etching the first portion 171 of the seventh interlayer insulating film. The fourth sub-interlayer insulating film 162 is not etched in the process of forming the third trench t3. The fourth sub-interlayer insulating film 162 may function as an etching stop film in the process of forming the third trench t3. Since the first portion 171 of the seventh interlayer insulating film has an etching selectivity with respect to the fourth sub-interlayer insulating film 162, the fourth sub-interlayer insulating film 162 might not be etched, while the first portion 171 of the seventh interlayer insulating film is being etched.

Figure 35:
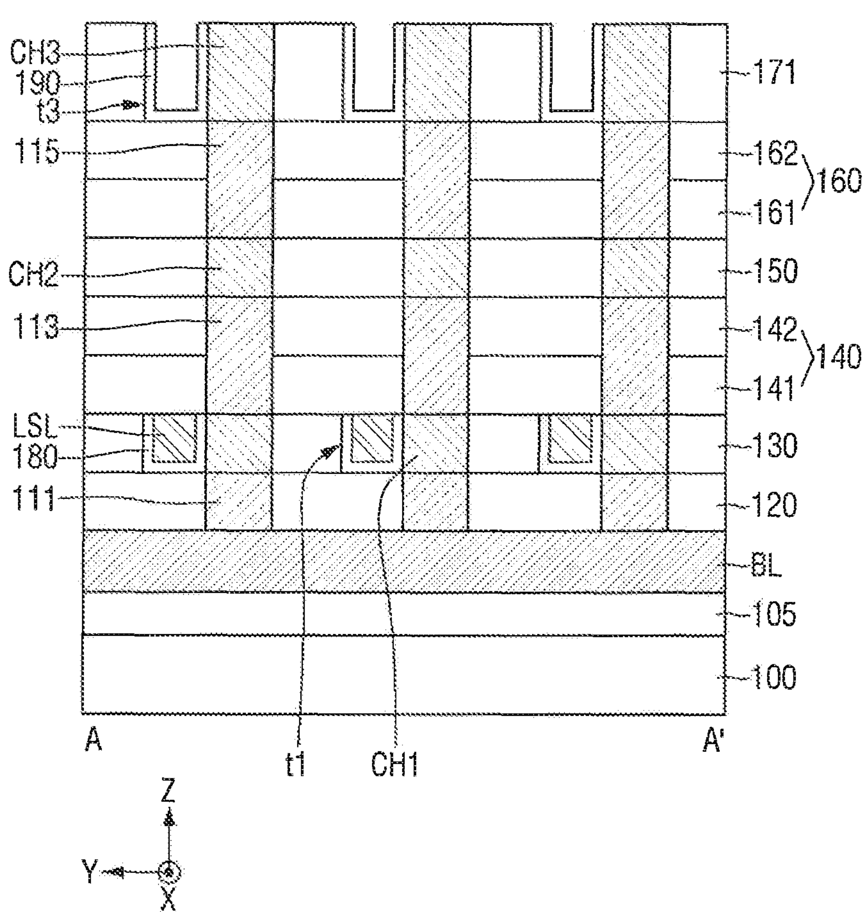

Referring to FIG. 35, a resistive insulating film 190 may be formed along side walls and a bottom surface of the third trench t3. The resistive insulating film 190 may be conformally formed along side walls and the bottom surface of the third trench t3, but the present inventive concept is not limited thereto.

Figure 36:
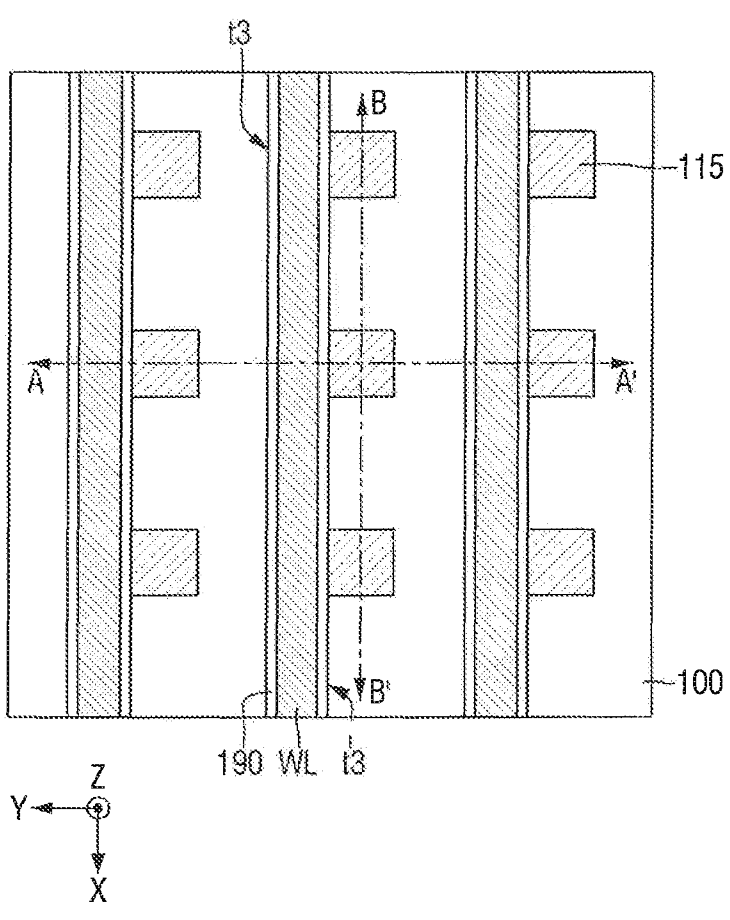
Figure 37:
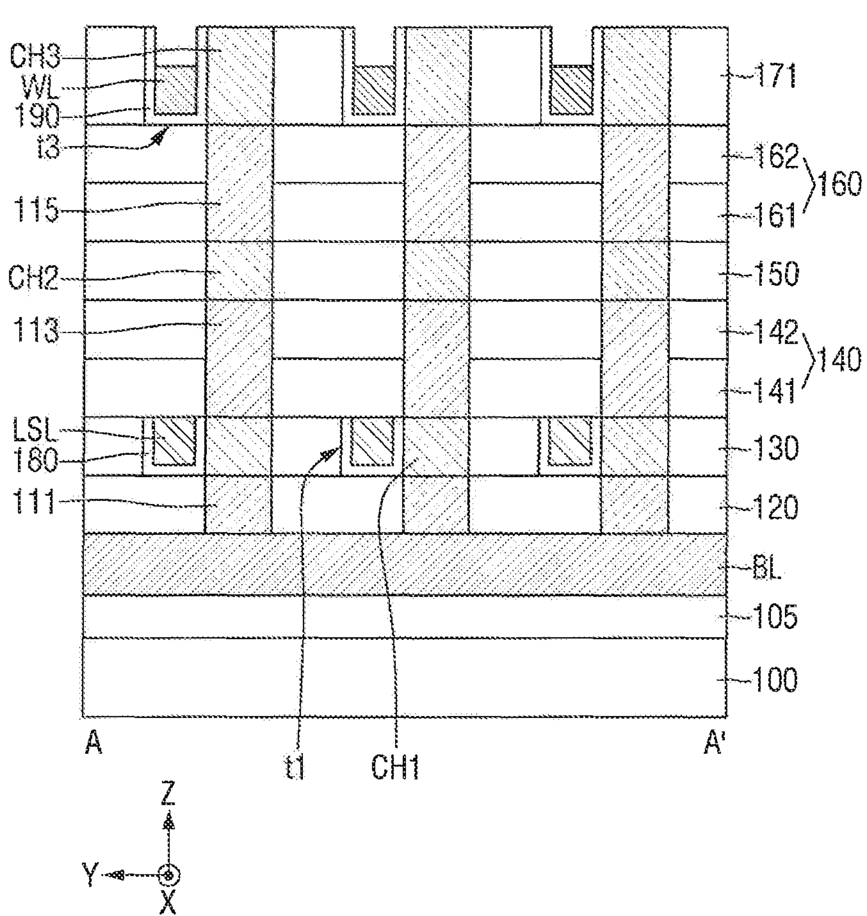

FIG. 36 is a plan view of an intermediate step illustrating a method for fabricating a resistive memory device according to an embodiment of the present inventive concept, and FIG. 37 is a cross-sectional view taken along line A-A' of FIG. 36.

Referring to FIGS. 36 and 37, a row line WL may be formed. The row line WL may be formed on the resistive insulating film 190. The row line WL may fill a part of the third trench t3. The row line WL may extend in the first direction X.

Figure 38:
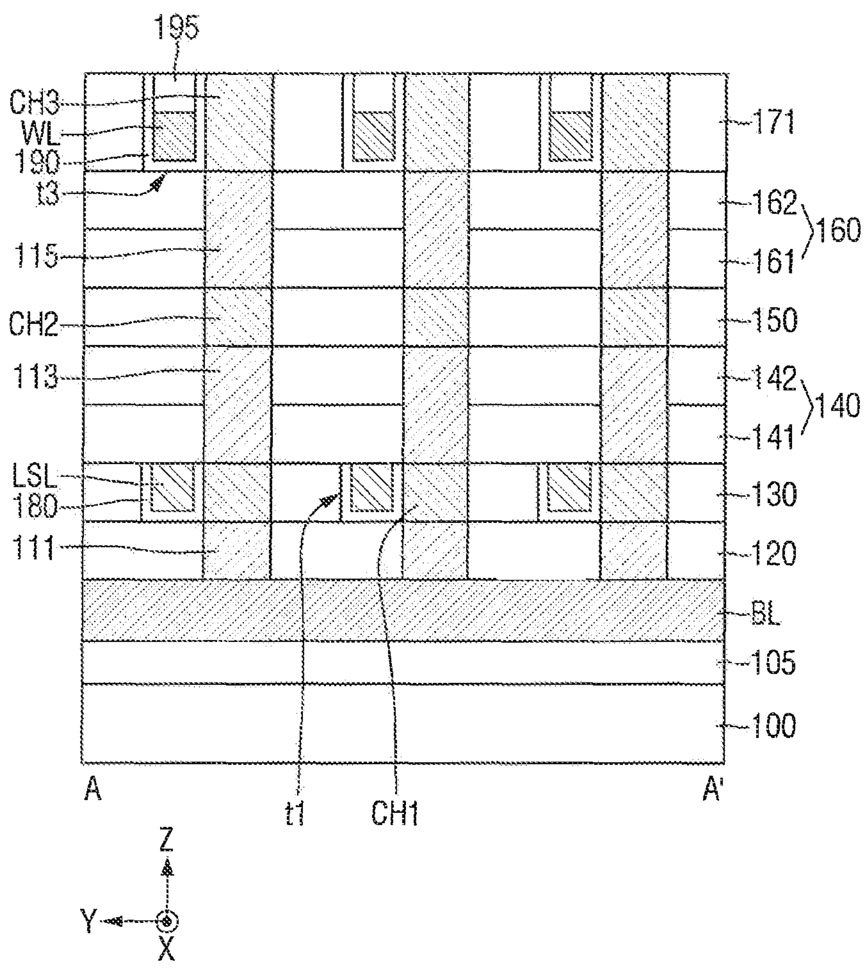

Referring to FIG. 38, a capping film 195 may be formed. The capping film 195 may be formed on the row line WL. The capping film 195 may fill the remaining space of the third trench t3 after forming the resistive insulating film 190 and the row line WL.

Figure 39:
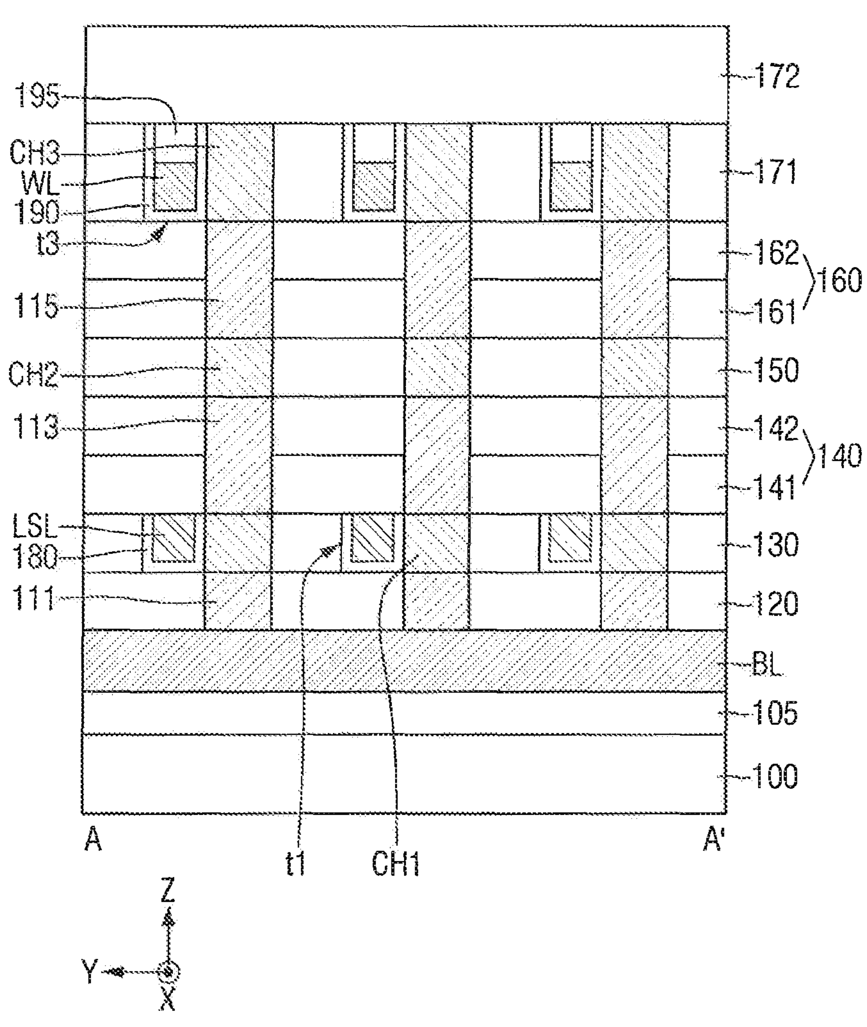

Referring to FIG. 39, a second portion 172 of the seventh interlayer insulating film may be formed on the capping film 195 and the third channel layer CH3.

Figure 40:
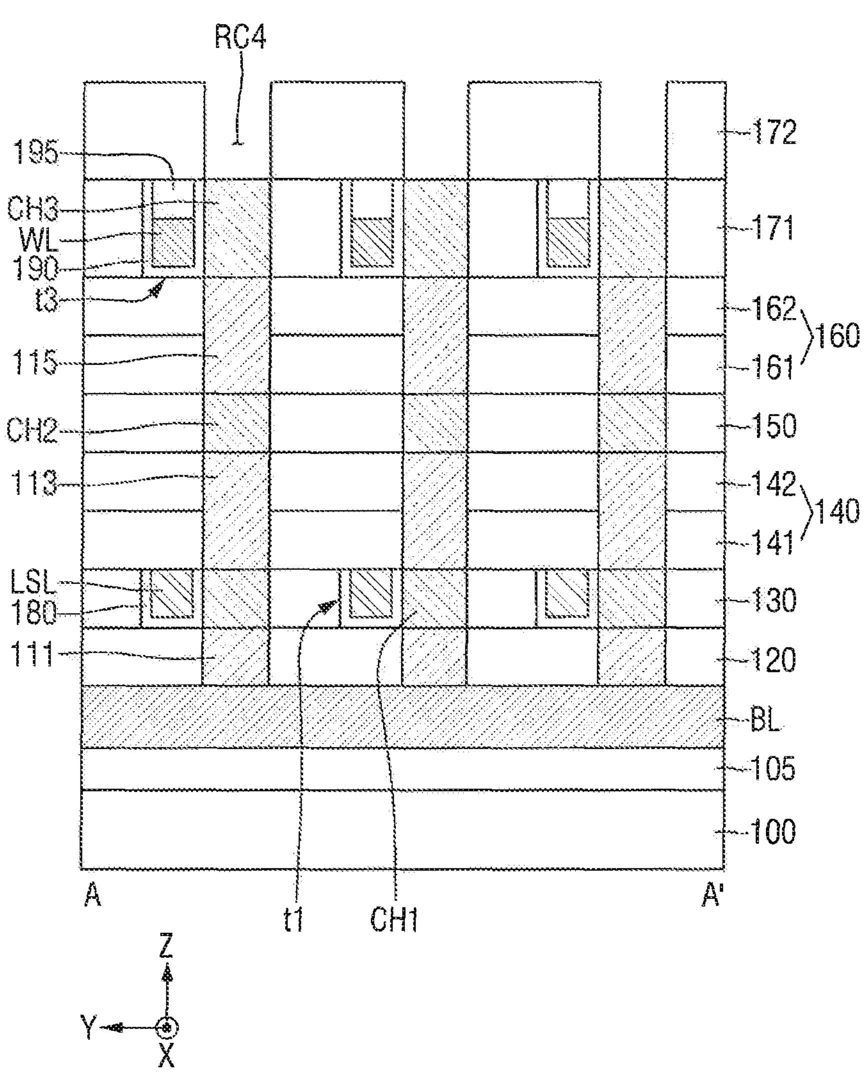

Referring to FIG. 40, a fourth recess RC4 is formed. The fourth recess RC4 may be formed by etching the second portion 172 of the seventh interlayer insulating film. The fourth recess RC4 may expose the surface of the third channel layer CH3.

Figure 41:
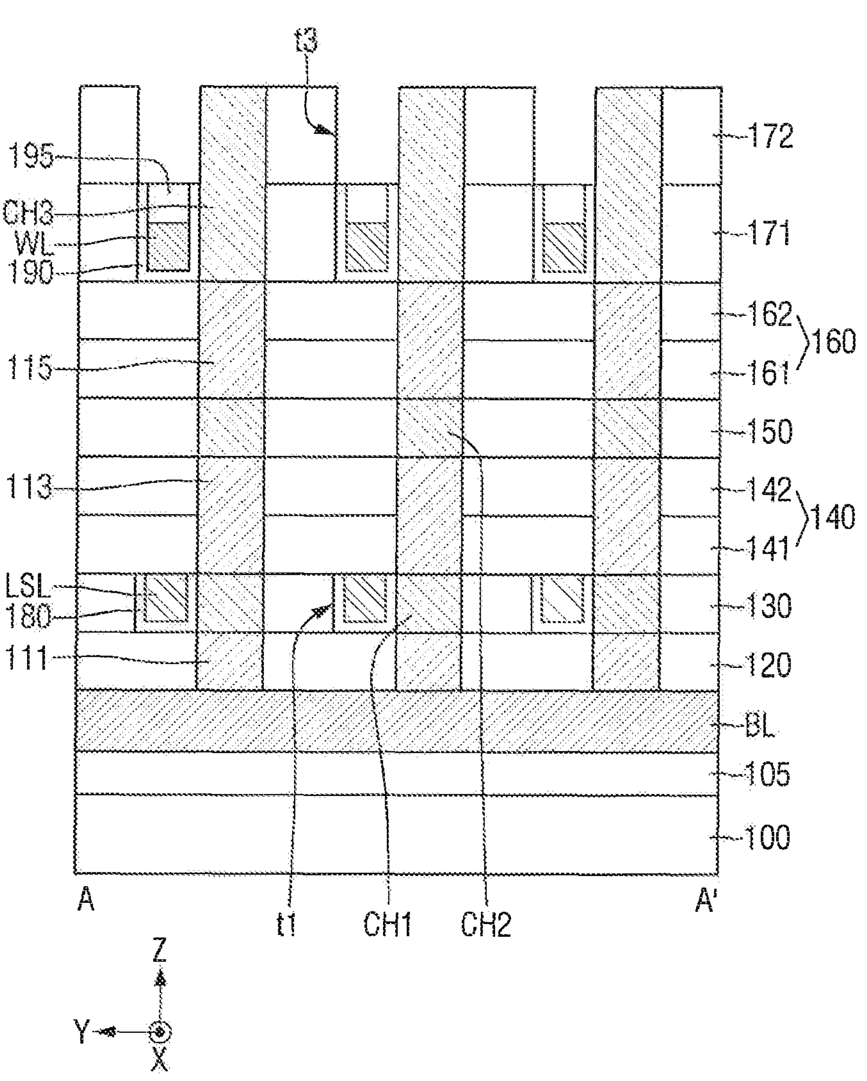

Referring to FIG. 41, the third channel layer CH3 may be formed. The third channel layer CH3 may fill the fourth recess RC4. A third trench t3 may then be formed.

First, the third channel layer CH3 that fills the fourth recess RC4 is formed. Subsequently, the third trench t3 may be formed on one side of the third channel layer CH3. The third trench t3 may expose the surface of the capping film 195.

Figure 42:
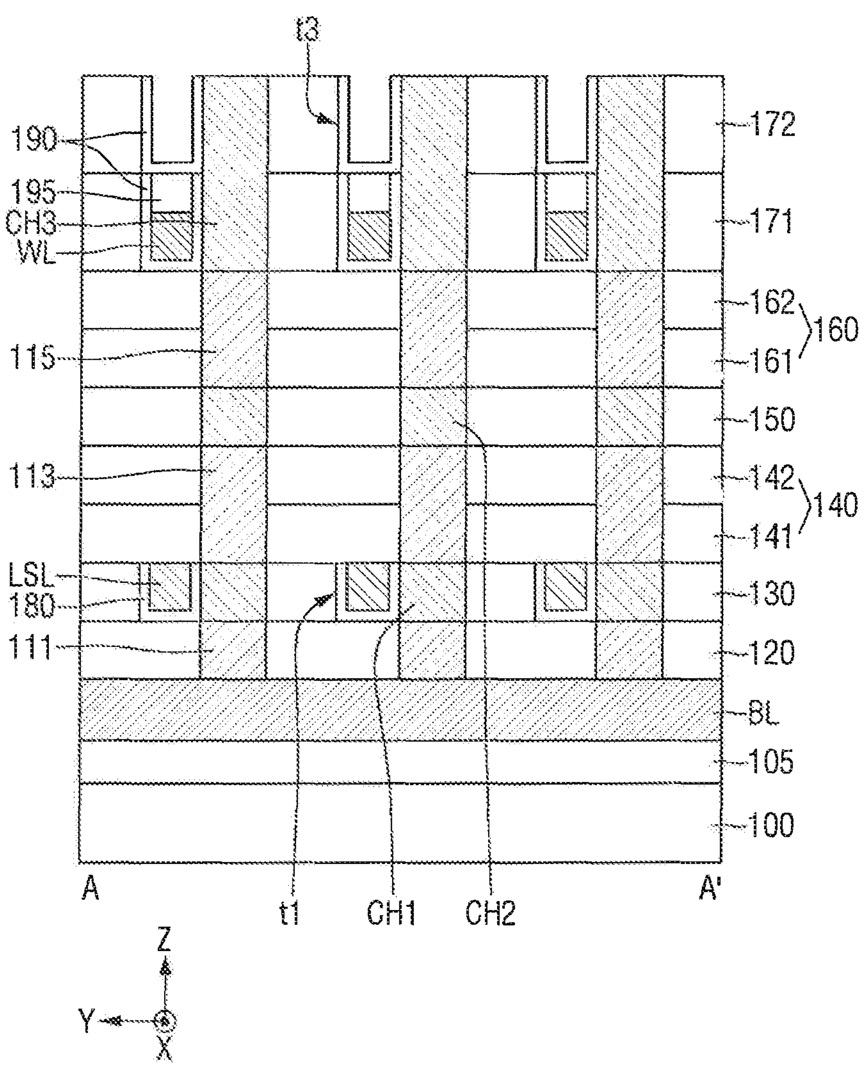

Referring to FIG. 42, the resistive insulating film 190 may be formed along side walls and a bottom surface of the third trench t3.

Figure 43:
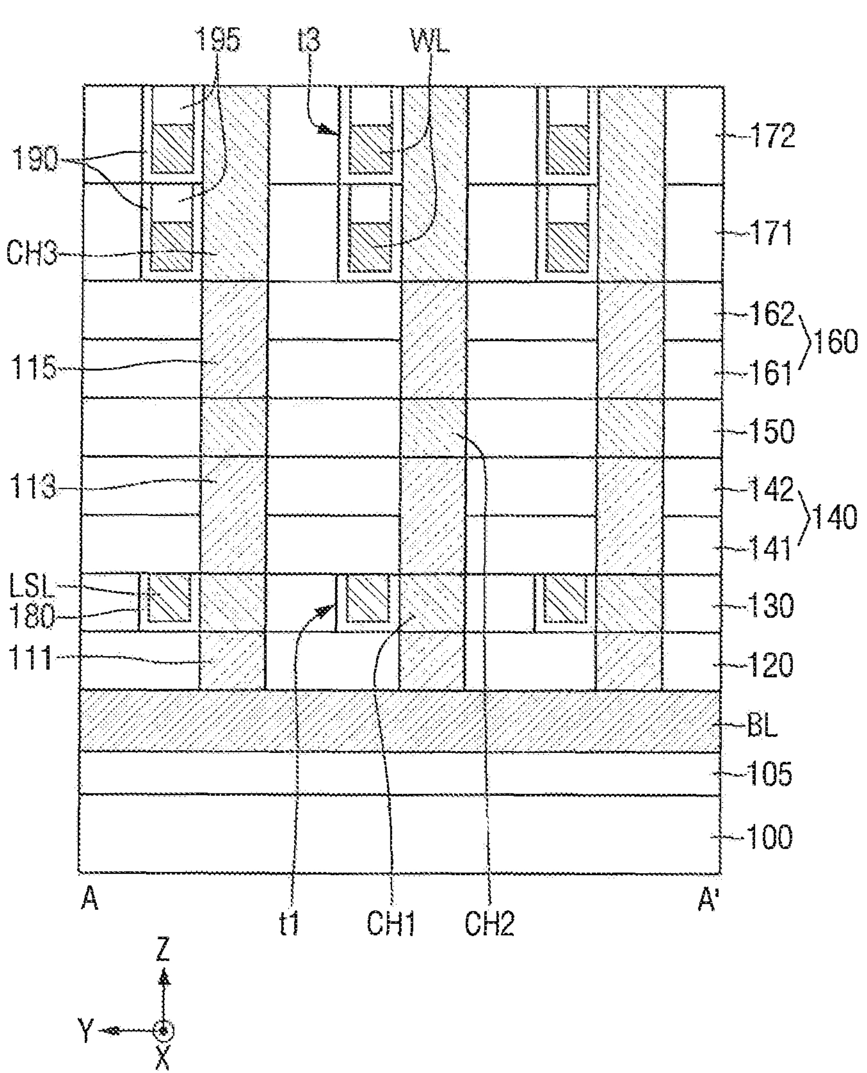

Referring to FIG. 43, the row line WL and the capping film 195 are sequentially formed. The row line WL and the capping film 195 may fill the third trench t3.

The row line WL may be additionally formed by repeating the processes of FIGS. 39 to 43. Each time the processes of FIGS. 39 to 43 are repeated, more row lines WL may be stacked in 3D (e.g., the third direction Z).

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A resistive memory device comprising:
a substrate;
a plurality of row lines extending in a first direction and spaced apart from each other in a second direction and a third direction, on the substrate, wherein the first direction, the second direction, and the third direction intersect each other;
a plurality of column lines extending in the second direction and spaced apart from each other in the first direction, on the substrate;
a plurality of upper selection lines extending in the second direction, between the row lines and the column lines;
a channel layer extending in the third direction and connected to the plurality of row lines; and
a first impurity region and a second impurity region spaced apart from each other in the third direction with the upper selection lines interposed therebetween.

2. The resistive memory device of claim 1, further comprising:
a plurality of lower selection lines extending in the first direction, between the upper selection lines and the column lines; and
a third impurity region placed on a first side of the lower selection lines.

3. The resistive memory device of claim 2,
wherein the second impurity region is placed on a second side, opposite to the first side, of the lower selection lines and spaced apart from the third impurity region in the third direction.

4. The resistive memory device of claim 1, further comprising:
a resistive insulating film placed between the channel layer and the row lines.

5. The resistive memory device of claim 4,
wherein the resistive insulating film includes at least one of $HfO_2$, $TiO_2$, or $Ta_2O_5$.

6. The resistive memory device of claim 4,
wherein resistance of the resistive insulating film changes depending on a magnitude of a voltage applied to the row lines.

7. The resistive memory device of claim 4,
wherein the resistive insulating film is placed along a bottom surface and side walls of the row lines.

8. The resistive memory device of claim 1,
wherein the channel layer includes polysilicon, and
the first and second impurity regions each comprise polysilicon including impurities.

9. The resistive memory device of claim 1, further comprising:
an interlayer insulating film placed between the upper selection lines and the row lines.

10. The resistive memory device of claim 9,
wherein the interlayer insulating film includes a first sub-interlayer insulating film and a second sub-interlayer insulating film disposed on the first sub-interlayer insulating film, and a thickness of the first sub-interlayer insulating film is greater than a thickness of the second sub-interlayer insulating film.

11. The resistive memory device of claim 1, wherein a thickness of the first impurity region is different from a thickness of the second impurity region.

12. A resistive memory device comprising:

a first row line extending in a first direction;

first and second column lines extending in a second direction intersecting the first direction and spaced apart from each other in the first direction;

a first upper selection line extending in the second direction and connected to the first column line to continuously form a current path between the first upper selection line and the first column line;

a second upper selection line extending in the second direction and connected to the second column line to continuously form a current path between the second upper selection line and the second column line; and a memory cell which is connected to the first row line and stores data, wherein the first upper selection line is activated and the second upper selection line is deactivated in response to a read command for reading the data stored in the memory cell.

13. The resistive memory device of claim 12, further comprising:

a second row line which extends in the first direction and is spaced apart from the first row line in the second direction, wherein a first voltage is applied to the first row line and a second voltage is applied to the second row line in response to the read command, and the first voltage is greater than the second voltage.

14. The resistive memory device of claim 12, wherein the second column line floats in response to the read command.

15. The resistive memory device of claim 12, wherein the memory cell is programmed with a first resistance or a second resistance greater than the first resistance.

16. The resistive memory device of claim 12, wherein a third voltage is applied to the first column line and a fourth voltage is applied to the second column line in response to the read command, and the third voltage is greater than the fourth voltage.

17. A resistive memory device comprising:

a substrate;

first and second row lines extending in a first direction and spaced apart from each other in a second direction, on the substrate, wherein the second direction intersects the first direction;

first and second column lines extending in the second direction and spaced apart from each other in the first direction, on the substrate;

first and second upper selection lines extending in the second direction, between the first and second row lines and the first and second column lines;

first and second lower selection lines extending in the first direction, between the first and second upper selection lines and the first and second column lines;

a memory cell which is connected to the first row line and the first column line and stores data;

first and second impurity regions spaced apart from each other in a third direction with the first upper selection line interposed therebetween, wherein the third direction intersects the first and second directions; and a third impurity region placed on a first side of the first lower selection line, wherein the second impurity region is placed on a second side, opposite to the first side, of the first lower selection line and spaced apart from the third impurity region in the third direction, and wherein the first upper selection line and the first lower selection line are activated and the second upper selection line and the second lower selection line are deactivated, in response to a read command for reading the data stored in the memory cell.

18. The resistive memory device of claim 17, wherein a first voltage is applied to the first row line and a second voltage is applied to the second row line in response to the read command, and the first voltage is greater than the second voltage.

19. The resistive memory device of claim 17, wherein the second column line floats in response to the read command.

20. The resistive memory device of claim 17, wherein a third voltage is applied to the first column line and a fourth voltage is applied to the second column line, in response to the read command, and the third voltage is greater than the fourth voltage.

* * * * *